(12) United States Patent
Inoue et al.

(10) Patent No.: US 7,391,227 B2
(45) Date of Patent: Jun. 24, 2008

(54) SHEET-LIKE PROBE, PROCESS FOR PRODUCING THE SAME AND ITS APPLICATION

(75) Inventors: Kazuo Inoue, Tokyo (JP); Katsumi Sato, Tokyo (JP)

(73) Assignee: JSR Corporation, Tokyo (JP)

(*) Notice: Subject to any disclaimer, the term of this patent is extended or adjusted under 35 U.S.C. 154(b) by 92 days.

(21) Appl. No.: 10/556,782

(22) PCT Filed: May 12, 2004

(86) PCT No.: PCT/JP2004/006385

§ 371 (c)(1),
(2), (4) Date: Nov. 14, 2005

(87) PCT Pub. No.: WO2004/102208

PCT Pub. Date: Nov. 25, 2004

(65) Prior Publication Data

US 2007/0069743 A1    Mar. 29, 2007

(30) Foreign Application Priority Data

May 13, 2003    (JP)    ............... 2003-134450

(51) Int. Cl.
*G01R 1/073* (2006.01)
*G01R 31/02* (2006.01)

(52) U.S. Cl. ..................... 324/754; 324/760
(58) Field of Classification Search .............. 324/754, 324/760, 755; 361/771; 29/846
See application file for complete search history.

(56) References Cited

U.S. PATENT DOCUMENTS 5,207,585 A    5/1993    Byrnes et al.
5,412,329 A *  5/1995    Iino et al. .................. 324/754

(Continued)

FOREIGN PATENT DOCUMENTS

JP    2001-015565    1/2001

(Continued)

OTHER PUBLICATIONS

U.S. Appl. No. 11/718,065, filed Apr. 26, 2007, Yoshioka, et al.

(Continued)

*Primary Examiner*—Ernest F Karlsen
(74) *Attorney, Agent, or Firm*—Oblon, Spivak, McClelland, Maier & Neustadt, P.C.

(57) ABSTRACT

Disclosed herein are a sheet-like probe capable of surly preventing positional deviation between electrode structures and electrodes to be inspected by temperature changes in a bum-in test, even when the object of inspection is a wafer having a large area of 8 inches or greater in diameter or a circuit device, the pitch of electrodes to be inspected of which is extremely small, and thus capable of stably retaining a good electrically connected state, and a production process and applications thereof. The sheet-like probe of the present invention comprises a contact film obtained by holding a plurality of electrode structures arranged in accordance with a pattern corresponding to respective electrodes to be connected and having a front-surface electrode part exposed to a front surface and a back-surface electrode part exposed to aback surface by an insulating film composed of a flexible resin, and a frame plate supporting the contract film.

16 Claims, 17 Drawing Sheets

U.S. PATENT DOCUMENTS

| | | | |
|---|---|---|---|
| 5,487,999 A | | 1/1996 | Farnworth et al. |
| 5,575,662 A | * | 11/1996 | Yamamoto et al. ............ 439/67 |
| 5,689,193 A | * | 11/1997 | Matsuda ..................... 324/754 |
| 6,005,401 A | * | 12/1999 | Nakata et al. ................ 324/754 |
| 6,275,051 B1 | * | 8/2001 | Bachelder et al. ........... 324/754 |
| 6,552,555 B1 | * | 4/2003 | Nuytkens et al. ............ 324/754 |
| 6,643,923 B1 | * | 11/2003 | Hishinuma et al. ............ 29/846 |
| 6,717,422 B2 | * | 4/2004 | Akram ....................... 324/754 |
| 6,774,650 B2 | * | 8/2004 | Maruyama et al. .......... 324/754 |
| 6,784,681 B2 | * | 8/2004 | Fujimoto et al. ............ 324/765 |
| 7,049,836 B2 | * | 5/2006 | Setaka ........................ 324/754 |
| 2002/0021138 A1 | * | 2/2002 | Budnaitis et al. ............ 324/760 |
| 2007/0069743 A1 | | 3/2007 | Inoue et al. |

FOREIGN PATENT DOCUMENTS

JP  2003-077559  3/2003

OTHER PUBLICATIONS

U.S. Appl. No. 11/718,576, filed May 3, 2007, Yoshioka, et al.

\* cited by examiner

PRIOR ART

SHEET-LIKE PROBE, PROCESS FOR PRODUCING THE SAME AND ITS APPLICATION

CONTINUING DATA

This application is a 371 of PCT/JP04/06385, May 12, 2004.

TECHNICAL FIELD

The present invention relates to a sheet-like probe used in electrical inspection of circuit devices, and a production process and application thereof, and more particularly to a sheet-like probe suitable for use in conducting electrical inspection of, for example, a plurality of integrated circuits formed on a wafer in a state of the wafer, and a production process and applications thereof.

BACKGROUND ART

In electrical inspection of, for example, wafers, on which a great number of integrated circuits have been formed, or circuit devices of electronic parts such as semiconductor devices, a probe device having inspection electrodes arranged in accordance with a pattern corresponding to a pattern of electrodes to be inspected of a circuit device to be inspected is used. As such a probe device, may be used that, on which inspection electrodes (inspection probes) each composed of a pin or blade are arranged.

When the circuit device to be inspected is a wafer, on which a great number of integrated circuits have been formed, it is however necessary to arrange a very great number of inspection probes upon production of a probe device for inspecting the wafer, so that such a probe device becomes extremely expensive. In addition, when the pitch of electrodes to be inspected is small, the production of the probe device itself becomes difficult. Further, since warpage generally occurs on wafers, and the condition of the warpage varies with individual products (wafers), it is difficult in fact to stably and surely bring inspection probes of the probe device into contact with a great number of electrodes to be inspected on the wafer, respectively.

For the above reasons, in recent years, there has been proposed a probe card comprising a circuit board for inspection, on one surface of which a plurality of inspection electrodes have been formed in accordance with a pattern corresponding to a pattern of electrodes to be inspected, an anisotropically conductive sheet arranged on one surface of the circuit board for inspection, and a sheet-like probe arranged on the anisotropically conductive sheet and obtained by arranging, in an insulating sheet, a plurality of electrode structures each extending through in a thickness-wise direction of the insulating sheet (see, for example, the following Prior Art. 1 and Prior Art. 2).

The sheet-like probe in such a probe card is specifically described. As illustrated in FIG. 42, this sheet-like probe 90 has a flexible circular insulating sheet 91 composed of, for example, a resin such as polyimide. In this insulating sheet 91, a plurality of electrode structures 95 extending in a thickness-wise direction of the sheet are arranged in accordance with a pattern corresponding to a pattern of electrodes to be inspected of a circuit device to be inspected. Each of the electrode structures 95 is formed by integrally connecting a projected front-surface electrode part 96 exposed to a front surface of the insulating sheet 91 and a plate-like back-surface electrode part 97 exposed to a back surface of the insulating sheet 91 to each other through a short circuit part 98 extending through in the thickness-wise direction of the insulating sheet 91. In addition, a ring-like holding member 92 composed of, for example, a ceramic is provided at a peripheral edge portion of the insulating sheet 91. This holding member 92 serves to control thermal expansion of the insulating sheet 91 in a plane direction thereof, thereby preventing positional deviation between the electrode structures 95 and the electrodes to be inspected by temperature changes a burn-in test.

However, such a sheet-like probe involves the following problems.

On a wafer, for example, having a diameter of at least 8 inches, at least 5,000 or 10,000 electrodes to be inspected are formed, and a pitch between the electrodes to be inspected is 160 μm or less. As a sheet-like probe for conducting inspection of such a wafer, it is necessary to use that having a large area corresponding to the wafer and at least 5,000 or 10,000 electrode structures arranged at a pitch of 160 μm or less.

The coefficient of linear thermal expansion of a material forming the wafer, for example, silicon is about $3.3 \times 10^{-6}$/K, while the coefficient of linear thermal expansion of a material forming the insulating sheet in the sheet-like probe, for example, polyamide is about $4.5 \times 10^{-5}$/K. Accordingly, when a wafer and a sheet-like probe each having a diameter of, for example, 30 cm at 25° C. are heated from 20° C. t 120° C., the change in diameter of the wafer is theoretically only 99 μm, while a change in diameter of the insulating sheet in the sheet-like probe reaches 1,350 μm, so that a difference in thermal expansion between the same is 1,251 μm.

When a great difference in the absolute quantity of thermal expansion in a plane direction is caused between the wafer and the insulating sheet in the sheet-like probe as described above, it is difficult to surely prevent positional deviation between the electrode structures and the electrodes to be inspected by temperature changes in the burn-in test even when the peripheral edge portion of the insulating sheet is fixed by the holding member having a coefficient of linear thermal expansion equivalent to the coefficient of linear thermal expansion of the wafer, so that a good electrically connected state cannot be stably retained.

In addition, even when the object of inspection is a small-sized circuit device, it is difficult to surely prevent positional deviation between the electrode structures and the electrodes to be inspected by temperature changes in the burn-in test when a pitch between the electrodes to be inspected is 50 μm or less, so that a good electrically connected state cannot be stably retained.

In order to solve such a problem, Prior Art. 1, identified hereinafter, proposes a means for relaxing the thermal expansion of the insulating sheet by fixing the insulating sheet to the holding member in a state tension has been applied to the insulating sheet.

However, in such a means, it is extremely difficult to evenly apply the tension to the insulating sheet in all directions of the plane direction thereof and a balance of the tension applied to the insulating sheet is changed by forming the electrode structures. As a result, the insulating sheet comes to have anisotropy on thermal expansion, so that even when the thermal expansion in one direction of the plane direction can be inhibited, thermal expansion in other directions intersecting said one direction cannot be inhibited. After all, the positional deviation between the electrode structures and the electrodes to be inspected by temperature changes cannot be prevented.

In addition, in order to fix the insulating sheet to the holding member in the state that the tension has been applied thereto, a complicated step of bonding the insulating sheet to the holding member under heating is required, so that a problem that increases in production cost is incurred arises.

Prior Art. 1: Japanese Patent Application Laid-Open No. 2001-15565;

Prior Art. 2: Japanese Patent Application Laid-Open No. 2002-184821.

DISCLOSURE OF THE INVENTION

The present invention has been made on the basis of the foregoing circumstances and has as its first object the provision of a sheet-like probe capable of surly preventing positional deviation between electrode structures and electrodes to be inspected by temperature changes in a burn-in test, even when the object of inspection is a wafer having a large area of 8 inches or greater in diameter or a circuit device, the pitch of electrodes to be inspected of which is extremely small, and thus capable of stably retaining a good electrically connected state.

A second object of the present invention is to provide a process capable of producing a sheet-like prove, by which in a burn-in test, positional deviation between electrode structures and electrodes to be inspected by temperature changes is surely prevented even when the object of inspection is a wafer having a large area of 8 inches or greater in diameter or a circuit device, the pitch of electrodes to be inspected of which is extremely small, and thus a good electrically connected state is stably retained.

A third object of the present invention is to provide a probe card capable of stably retaining a good electrically connected state in a burn-in test even when the object of inspection is a wafer having a large area of 8 inches or greater in diameter or a circuit device, the pitch of electrodes to be inspected of which is extremely small.

A fourth object of the present invention is to provide an inspection apparatus for circuit devices, which is equipped with the above-described probe card.

A fifth object of the present invention is to provide a wafer inspection apparatus equipped with the above-described probe card.

A sixth object of the present invention is to provide a wafer inspection method making use of the above-described probe card.

According to the present invention, there is provided a sheet-like probe comprising:

a contact film obtained by holding a plurality of electrode structures arranged in accordance with a pattern corresponding to respective electrodes to be connected and having a front-surface electrode part exposed to a front surface and a back-surface electrode part exposed to a back surface by an insulating film composed of a flexible resin, and a frame plate supporting the contact film.

According to the present invention, there is also provided a sheet-like probe suitable for use in electrical inspection of a circuit device, which comprises a frame plate made of a metal, in which a plurality of through-holes each extending through in a thickness-wise direction of the frame plate have been formed corresponding to an electrode region, in which electrodes to be inspected have been formed, of the circuit device, which is an object of inspection, and a plurality of contact films each supported by a peripheral portion about the respective through-hole in the frame plate, wherein each of the contact films is composed of an insulating film formed of a flexible resin and electrode structures extending through in the insulating film in a thickness-wise direction thereof, arranged in accordance with a pattern corresponding to a pattern of the electrodes to be inspected in the electrode region and each having a front-surface electrode part exposed to a front surface of the contact film and a back-surface electrode part exposed to a back surface of the contact film, and each of the electrode structures is arranged so as to be located in the respective through-holes in the frame plate.

According to such a sheet-like probe, the plurality of through-holes are formed in the frame plate corresponding to the electrode region, in which the electrodes to be impacted have been formed, of the circuit device, which is the object of inspection, the contact films arranged in the respective through-holes may be small in area, and each of the contact films small in area is little in the absolute quantity of thermal expansion in a plane direction of the insulating film thereof, so that the thermal expansion of the insulating film can be surely restrained by the frame plate. Accordingly, in a burn-in test, positional deviation between the electrode structures and the electrodes to be inspected by temperature changes is surely prevented even when the object of inspection is a wafer having a large area of, for example, 8 inches or greater in diameter or a circuit device, the pitch of electrodes to be inspected of which is extremely small. As a result, a good electrically connected state is stably retained.

According to the present invention, there is further provided a sheet-like probe suitable for use in electrical inspection of a circuit device, which comprises a frame plate, in which a plurality of through-holes extending through in a thickness-wise direction of the frame plate have been formed corresponding to an electrode region, in which electrodes to be inspected have been formed, of the circuit device, which is an object of inspection, and a contact film arranged on and supported by the frame plate, wherein the contact film is composed of an insulating film formed of a flexible resin and electrode structures extending through in the insulating film in a thickness-wise direction thereof, arranged in accordance with a pattern corresponding to a pattern of the electrodes to be inspected and having a front-surface electrode part exposed to a front surface of the contact film and a back-surface electrode part exposed to a back surface of the contact film, and each of the electrode structures is arranged so as to be located in the respective through-holes in the frame plate.

According to such sheet-like probe, the plurality of through-holes are formed in the frame plate corresponding to the electrode region, in which the electrodes to be inspected have been formed, of the circuit device, which is the object of inspection, and the contact film is arranged on the frame plate in such a manner that the electrode structures are located in the respective through-holes in the frame plate, whereby the contact film is supported by the frame plate over the whole surface thereof, so that the thermal expansion of the insulating film thereof in the plane direction is surely restrained by the frame plate even when the contact film has a large area. Accordingly, in a burn-in test, positional deviation between the electrode structures and the electrodes to be inspected by temperature changes is assuredly prevented even when the object of inspection is a wafer having a large area of, for example, 8 inches ore greater in diameter or a circuit device, the pitch of electrodes to be inspected of which is extremely small. As a result, a good electrically connected state is stably retained.

In such a sheet-like probe, a plurality of contact films independent of each other may be arranged so as to align along the surface of the frame plate.

The sheet-like probes according to the present invention may be suitably used for conducting electrical inspection of each of a plurality of integrated circuits formed on a wafer in a state of the wafer.

The sheet-like probes according to the present invention are extremely effective when the pitch between the electrode structures is 40 to 250 μm, and the total number of the electrode structures is at least 5,000.

In the sheet-like probes according to the present invention, the front-surface electrode part in each of the electrode structures may preferably be in a projected form protruding from the front surface of the insulating film.

A ratio of the projected height of the front-surface electrode part to the diameter thereof in the electrode structure may preferably be 0.2 to 3.

The electrode structure may preferably be formed by linking the front-surface electrode part and the back-surface electrode part to each other through a short circuit part extending through in the insulating film.

The back-surface electrode part in the electrode structure may have a part formed of the same metal as a metal forming the frame plate.

A coating film formed of a high-conductive metal may be formed on the back-surface electrode part in the electrode structure.

The coefficient of linear thermal expansion of the frame plate may preferably be at most $3 \times 10^{-5}$/K.

According to the present invention, there is still further provided a process for producing a sheet-like probe, which comprises the steps of:

providing a laminate material having a metal plate for forming a frame plate and a sheet for forming insulating film, which has been integrally laminated on the metal plate for forming a frame plate, forming through-holes in the resin sheet for forming insulating film in the laminate material in accordance with a pattern corresponding to a pattern of electrode structures to be formed, subjecting the laminate material to a plating treatment, thereby forming short circuit parts formed in the respective through-holes in the resin sheet for forming insulating film and linked to the metal plate for forming a frame plate, and front-surface electrode parts linked to the respective short circuit parts, and then subjecting the metal plate for forming a frame plate to an etching treatment, thereby forming a frame plate, in which through-holes have been formed.

In the process according to the present invention for producing the sheet-like probe, it is preferable that the metal plate for forming a frame plate be subjected to the etching treatment to form back-surface electrode parts linked to the short circuit part by a part of the metal plate for forming a frame plate, as well as forming the frame plate, in which the through-holes have been formed.

According to the present invention, there is yet still further provided a probe card comprising any one of the sheet-like probes described above.

According to the present-invention, there is yet still further provided a probe card suitable for use in conducting electrical inspection of each of a plurality of integrated circuits formed on a wafer in a state of the wafer, which comprises:

a circuit board for inspection, on a front surface of which inspection electrodes have been formed in accordance with a pattern corresponding to a pattern of electrodes to be inspected of the integrated circuits of the wafer, which is an object of inspection, an anisotropically conductive connector arranged on the front surface of the circuit board for inspection, and any one of the sheet-like probes described above arranged on the front surface of the anisotropically conductive connector.

According to the present invention, there is yet still further provided an inspection apparatus for circuit devices, which comprises the probe card described above.

According to the present invention, there is yet still further provided a wafer inspection apparatus for conducting electrical inspection of each of a plurality of integrated circuits formed on a wafer in a state of the wafer, which comprises the probe card described above.

According to the present invention, there is yet still further provided a wafer inspection method comprising electrically connecting each of a plurality of integrated circuits formed on a wafer to a tester through the probe card described above to perform electrical inspection of the integrated circuits formed on the wafer.

According to the sheet-like probes of the present invention, positional deviation between the electrode structures and the electrodes to be inspected by temperature changes can be surely prevented in a burn-in test even when the object of inspection is a wafer having a large area of 8 inches or greater in diameter or a circuit device, the pitch of electrodes to be inspected of which is extremely small, and thus a good electrically connected state can be stably retained.

According to the process of the present invention for producing the sheet-like probe, there can be produced a sheet-like probe capable of surly preventing, positional deviation between the electrode structures and the electrodes to be inspected by temperature changes in a burn-in test even when the object of inspection is a wafer having a large area of 8 inches or greater in diameter or a circuit device, the pitch of electrodes to be inspected of which is extremely small, and thus capable of stably retaining a good electrically connected state.

According to the probe cards of the present invention, a good electrically connected state can be stably retained in a burn-in test even when the object of inspection is a wafer having a large area of 8 inches or greater in diameter or a circuit device, the pitch of electrodes to be inspected of which is extremely small.

Such probe cards are extremely suitable for probe cards used in wafer inspection apparatus for conducting electrical inspection of a wafer having a large area of 8 inches or greater in diameter, or inspection apparatus for conducting electrical inspection of circuit devices, the pitch of electrodes to be inspected of which is extremely small.

BEST MODE FOR CARRYING OUT THE INVENTION

The embodiments of the present invention will hereinafter be described in detail.

<Sheet-like Probe>

Figure 1:
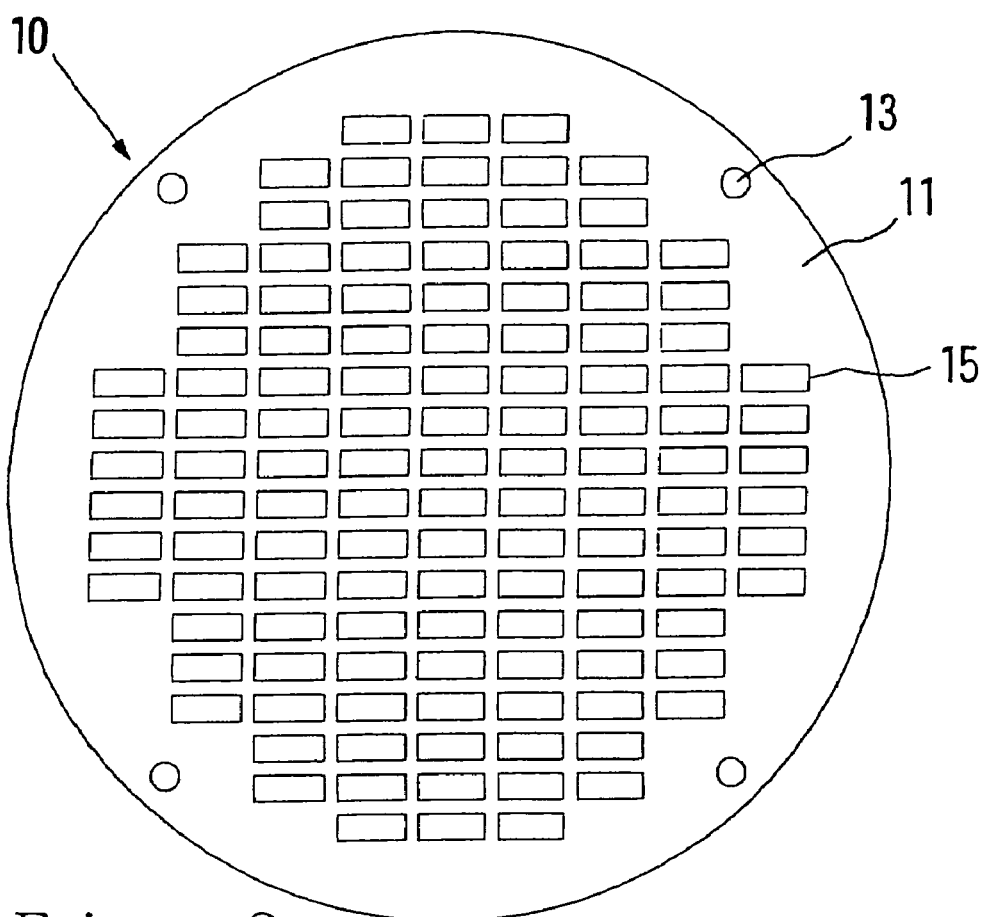
FIG. 1 is a plan view illustrating a sheet-like probe according to a first embodiment of the present invention.
Figure 2:
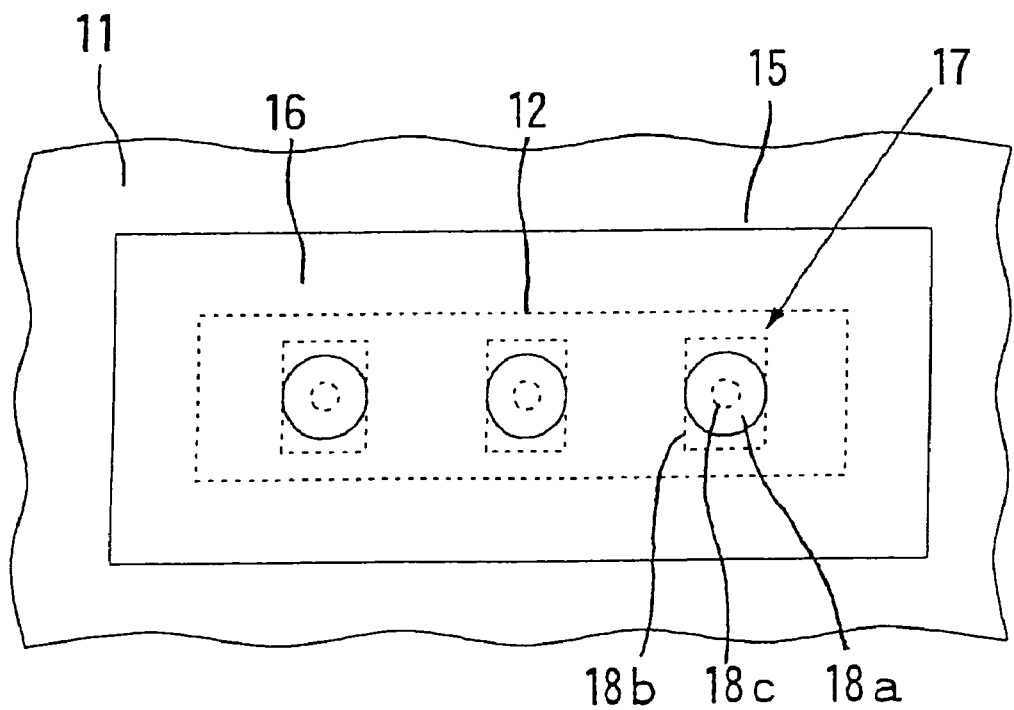
FIG. 2 is a plan view illustrating, on an enlarged scale, a contact film of the sheet-like probe according to the first embodiment.
Figure 3:
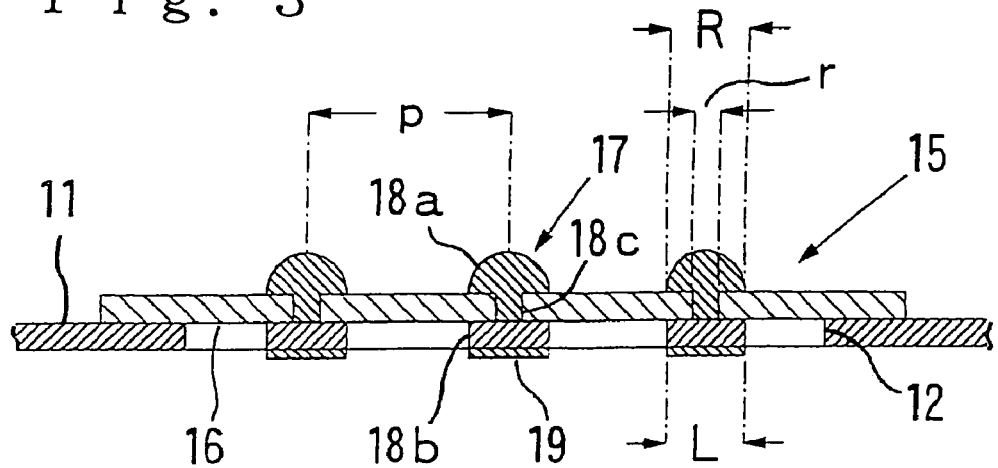
FIG. 3 is a cross-sectional view illustrating, on an enlarged scale, the construction of the contact film of the sheet-like probe according to the first embodiment.

FIG. 1 is a plan view illustrating a sheet-like probe according to a first embodiment of the present invention, FIG. 2 is a plan view illustrating, on an enlarged scale, a contact film of the sheet-like probe according to the first embodiment, and FIG. 3 is a cross-sectional view illustrating, on an enlarged scale, the contact film of the sheet-like probe according to the first embodiment.

Figure 4:
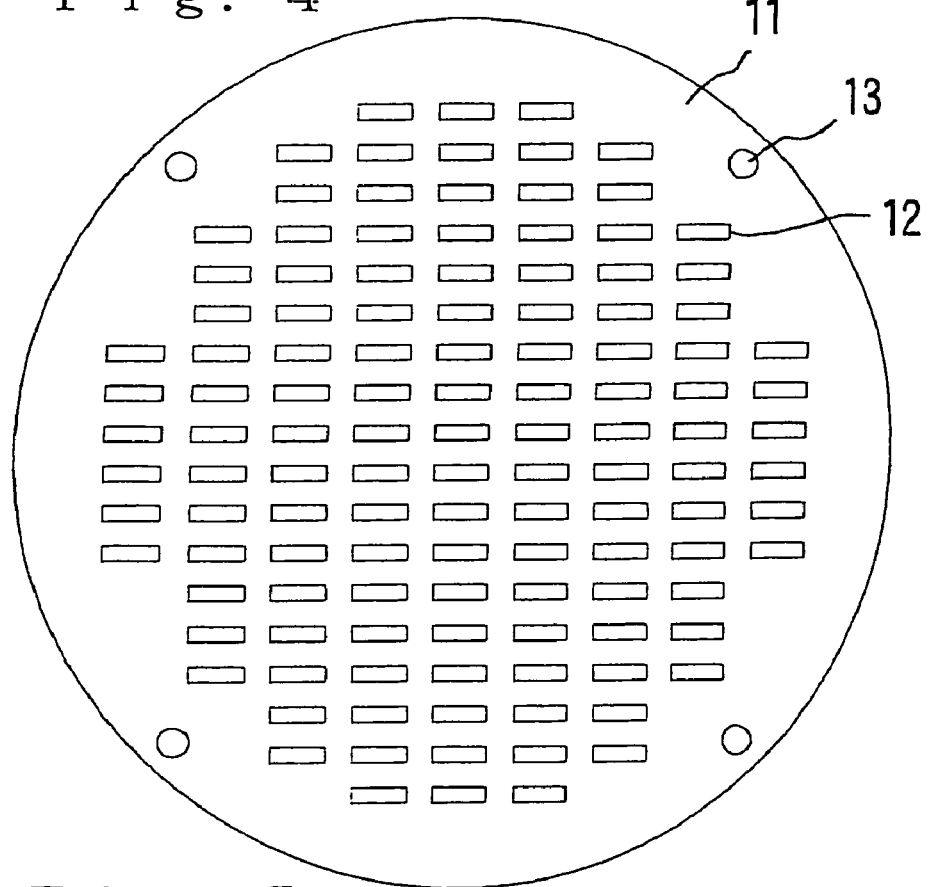
FIG. 4 is a plan view illustrating a frame plate in the sheet-like probe according to the first embodiment.

The sheet-like probe 10 according to the first embodiment is used to conduct, on a wafer, on which, for example, a plurality of integrated circuits have been formed, electrical inspection as to each of the integrated circuits in a state of the wafer, and has a metal-made frame plate 11, in which through-holes 12 each extending through in a thickness-wise direction of the frame plate have been formed, as also illustrated in FIG. 4. The through-holes 12 in this frame plate 11 are formed corresponding to a pattern of an electrode region, in which electrodes to be inspected have been formed, of an integrated circuit in a wafer, which is an object of inspection. In the frame plate 11 in this embodiment, positioning holes 13 for conducting positioning to an anisotropically conductive connector and a circuit board for inspection, which will be described subsequently, are formed.

As a metal for forming the frame plate 11, may be used iron, copper, nickel, titanium or an alloy or alloy steel thereof. However, an iron-nickel alloy steel such as 42 alloy, invar or covar is preferred in that the through-holes 12 can be easily formed by an etching treatment in a production process which will be described subsequently.

As the frame plate 11, is preferably used a material having a coefficient of linear thermal expansion of at most $3 \times 10^{-5}$/K, more preferably $-1 \times 10^{-7}$ to $1 \times 10^{-5}$/K, particularly preferably $1 \times 10^{-6}$ to $8 \times 10^{-6}$/K.

Specific examples of such a material for forming the frame plate 11 include invar alloys such as invar, Elinvar alloys such as Elinvar, and alloys or alloy steels such as superinvar, covar and 42 alloy.

The thickness of the frame plate 11 is preferably, 3 to 150 µm, more preferably 5 to 100 µm.

If this thickness is too small, the strength required of the frame plate for supporting the contact films 15 may not be achieved in some cases. If this thickness is too great on the other hand, it may be difficult in some cases to form the through-holes 12 with high dimensional precision by an etching treatment in the production process which will be described subsequently.

In each of the through-holes 12 in the frame plate 11, a contact film 15 is arranged in a state supported by a peripheral portion about the through-hole 12 in the frame plate 11 and in a state independent of contact films 15 arranged in adjoining through-holes 12.

Each of the contact films 15 has a flexible insulating film 16 as illustrated in FIG. 3. In this insulating film 16, a plurality of electrode structures 17 each extending in a thickness-wise direction of the insulating film 16 and composed of a metal are arranged in relation separated from each other in a plane direction of the insulating film 16 in accordance with a pattern corresponding to a pattern of electrodes to be inspected in the electrode region of the wafer that is the object of inspection. The contact film 15 is arranged in such a manner that the respective electrode structures 17 are located in the through-hole 12 in the frame plate 11.

Each of the electrode structures 17 is formed by integrally linking a projected front-surface electrode part 18a exposed to a front surface of the insulating film 16 and a plate-like back-surface electrode part 18b exposed to a back surface of the insulating film 16 to each other through a short circuit part 18c extending through in the thickness-wise direction of the insulating film 16. In this embodiment, a coating film 19 formed of a high-conductive metal is formed on the back-surface electrode part 18b.

No particular limitation is imposed on a material for forming the insulating films 16 so far as it has insulating property and is flexible, and a resin material such as polyimide or liquid crystal polymer, or a composite material thereof may be used. However, polyimide is preferably used in that through-holes for the electrode structures can be easily formed by an etching treatment in the production process which will be described subsequently.

As other materials for forming the insulating films 16, may be used meshes or nonwoven fabrics, or those obtained by impregnating these with a resin or elastic polymeric substance. As fibers for forming such meshes or nonwoven fabrics, may be used organic fibers such as aramide fiber, polyethylene fiber, polyarylate fiber, nylon fiber, fluorocarbon resin fibers such as Teflon (Registered trademark) fiber, and polyester fiber. Such a material is used as a material for forming the insulating films 16, whereby the flexibility of the whole contact film 15 is not greatly deteriorated even when the electrode structures 17 are arranged at a small pitch, so that even if a scatter is existed in projected height of the electrode structures 17 or projected height of the electrodes to be inspected, the scatter is sufficiently cancelled out by the flexibility of the contact film 15, and so stable electrical connection to each of the electrodes to be inspected can be surely achieved.

No particular limitation is imposed on the thickness of the insulating film 16 so far as the flexibility of the insulating film 16 is not impaired. However, it is preferably 5 to 150 µm, more preferably 7 to 100 µm, still more preferably 10 to 50 µm.

As a material for forming the electrode structures 17, may be used nickel, iron, copper, gold, silver, palladium, iron, cobalt, tungsten, rhodium, or an alloy or alloy steel thereof. The electrode structures 17 may be any of those formed of a single metal as a whole, those formed of an alloy or alloy steel of at least two metals and those obtained by laminating at least two metals.

When electrical inspection is conducted on electrodes to be inspected, on the surfaces of which an oxide film has been formed, it is necessary to bring the electrode structures 17 of the sheet-like probe into contact with electrode to be inspected to break the oxide film on the surface of the electrode to be inspected by the front-surface electrode part 18a of the electrode structure 17, thereby achieving electrical connection between the electrode structure 17 and the electrode to be inspected. Therefore, the front-surface electrode part 18a of the electrode structure 17 preferably has such hardness that capable of easily breaking the oxide film. In order to obtain such front-surface electrode parts 18a, a powdery material having high hardness may be contained in a metal forming the front-surface electrode parts 18a.

As such a powdery material, those which may be used include diamond powder, silicon nitride, silicon carbide, ceramic, glass or the like. A proper amount of such a non-conductive powdery material is contained, whereby the oxide film formed on the surface of the electrode to be inspected can be broken by the front-surface electrode part 18a of the electrode structure 17 without impairing the conductivity of the electrode structure 17.

In order to easily-break the oxide film on the surface of the electrode to be inspected, the front-surface electrode part 18a in the electrode structure 17 may be shaped into a sharply projected form, or fine irregularities may be formed in the surface of the front-surface electrode part 18a.

A part or the whole of the back-surface electrode part 18b in each of the electrode structures 17 is preferably composed of the same metal as a metal forming the frame plate 11 in that the back-surface electrode part 18b can be easily formed by the production process which will be described subsequently.

A pitch p between the electrode structures 17 in the contact film 15 is preset according to a pitch between electrodes to be inspected in a wafer, which is an object of inspection and, for example, preferably 40 to 250 µm, more preferably 40 to 150 µm.

The term "pitch between electrode structures" as used herein means the shortest center distance between adjoining electrode structures.

In the electrode structure 17, a ratio of a projected height to a diameter R in the front-surface electrode part 18a is preferably 0.2 to 3, more preferably 0.25 to 2.5. By satisfying these conditions, the patterned electrode structure 17 can easily be formed correspondingly to the pattern of the electrode to be inspected, even when the pitch of the electrode to be inspected is small and minute, whereby the stable electrically connected state to the wafer can be obtained with certainty.

The diameter R of the front-surface electrode part 18a is preferably 1 to 3 times, more preferably 1 to 2 times as large as the diameter r of the short circuit part 18c.

The diameter R of the front-surface electrode part 18a is also preferably 30 to 75%, more preferably 40 to 60% of the pitch p of the electrode structures 17.

The outer diameter L of the back-surface electrode part 18b is only required to be greater than the diameter of the short circuit part 18c and smaller than the pitch p of the electrode structures 17 and is preferably great as much as possible. Stable electrical connection can be thereby achieved with certainty even to, for example, an anisotropically conductive sheet.

The diameter r of the short circuit part 18c is preferably 15 to 75%, more preferably 20 to 65% of the pitch p of the electrode structures 17.

The specific dimensions of each of the electrode structures 17 will be described. The projected height of the front-surface electrode part 18a is preferably 15 to 50 μm, more preferably 15 to 30 μm in that stable electrical connection to the electrode to be inspected can be achieved.

The diameter R of the front-surface electrode part 18a is preset in view of the above-described conditions, the diameter of the electrode to be inspected, and the like. However, it is, for example, preferably 30 to 200 μm, more preferably 35 to 150 μm.

The diameter r of the short circuit part 18c is preferably 10 to 120 μm, more preferably 15 to 100 μm in that sufficiently high strength is achieved.

The thickness of the back-surface electrode part 18b is preferably 15 to 150 μm, more preferably 20 to 100 μm in that sufficiently high strength and excellent repetitive durability are achieved.

The coating film 19 formed on the back-surface electrode part 18b in the electrode structures 17 is preferably formed of a chemically stable high-conductive metal. Specific examples of such a metal include gold, silver, palladium and rhodium.

The coating film can also be formed on the front-surface electrode part 18a in the electrode structure 17. When the electrodes to be inspected are composed of, for example, a solder material, a diffusion-resistant metal such as silver, palladium or rhodium is preferably used as the metal forming the coating film from the viewpoint of preventing diffusion of the solder material.

The sheet-like probe 10 according to the first embodiment can be produced, for example, in the following manner.

Figure 5:
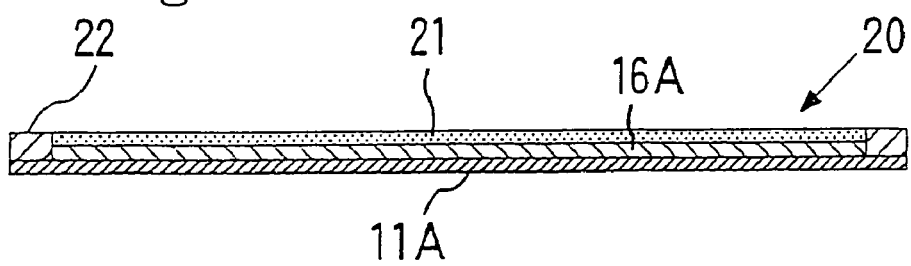
FIG. 5 is a cross-sectional view illustrating the construction of a laminate material for producing the sheet-like probe.

As illustrated in FIG. 5, a laminate material 20 having a circular metal plate 11A for forming a frame plate and a circular sheet 16A for forming insulating films, which is integrally laminated on this metal plate 11A for forming a frame plate and has a diameter smaller than the diameter of the metal plate 11A for forming a frame plate, is first produced. In the laminate material 20 of the illustrated embodiment, a metal layer 21 for forming a metal mask is integrally provided on the whole surface of the sheet 16A for forming insulating films, and a protecting tape 22 is provided on the surface of the metal plate 11A for forming a frame plate along a peripheral edge portion thereof.

In this embodiment, the thickness of the metal layer 21 is preferably 2 to 15 μm, more preferably 5 to 15 μm. If this thickness is smaller than 2 μm, the strength required for withstanding laser beams used in laser beam machining subjected to the sheet for forming insulating films, which will be described subsequently, is not obtained, so that it may be difficult in some cases to surely form electrode structures 17. If this thickness exceeds 15 μm on the other hand, it may be difficult in some cases to form openings in a metal mask, which will be described subsequently, with high dimensional precision by an etching treatment.

As a material for forming the metal layer 21, may be used copper, nickel or the like.

As examples of a method for forming the metal layer 21 on the sheet 16A for forming insulating films, may be mentioned sputtering, electroless plating and a bonding method.

Figure 6:
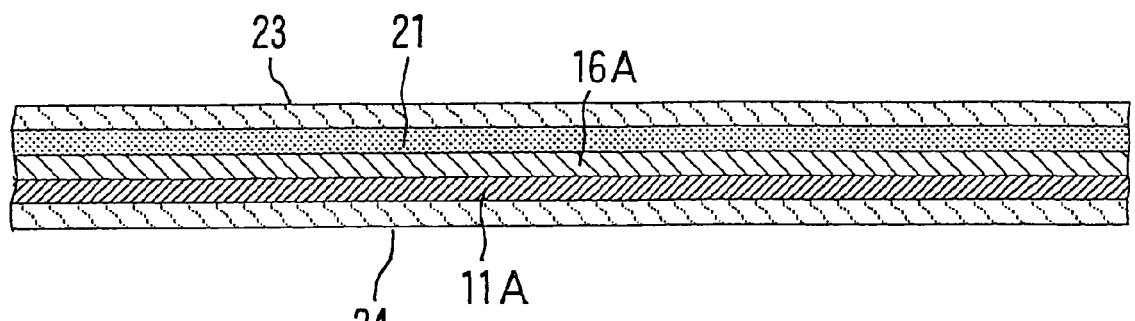
FIG. 6 is a cross-sectional view illustrating a state that resist films have been formed on both surfaces of the laminate material shown in FIG. 5.
Figure 7:
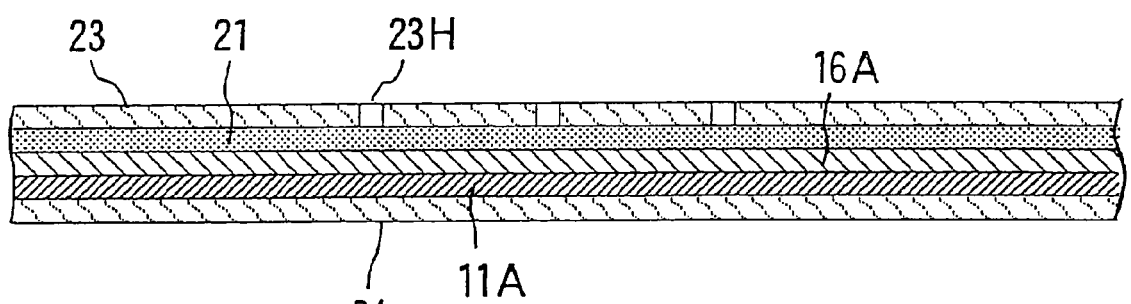
FIG. 7 is a cross-sectional view illustrating a state that patterned holes have been formed in the resist film formed on a metal layer.
Figure 8:
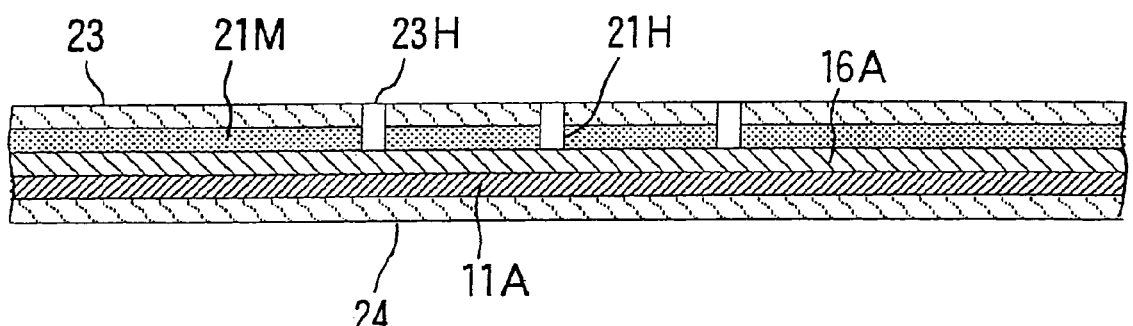
FIG. 8 is a cross-sectional view illustrating a state that openings have been formed in the metal layer to form a metal mask.

As illustrated in FIG. 6, resist films 23 and 24 composed of a photoresist are then formed on both surfaces of the laminate material 20, i.e., the respective surfaces of the metal layer 21 and the metal plate 11A for forming a frame plate, and a plurality of patterned holes 23H are formed in the resist film 23 formed on the metal layer 21 in accordance with a pattern corresponding to a pattern of electrode structures 17 to be formed as illustrated in FIG. 7. Thereafter, the metal layer 21 is subjected to an etching treatment through the patterned holes 23H, thereby forming a metal mask 21M, in which a plurality of openings 21H have been formed in accordance with the pattern corresponding to the pattern of the electrode structures 17 to be formed, as illustrated in FIG. 8.

As the photoresist for forming the resist films 23 and 24, may be used any of various photoresists for plating, photosensitive dry films, and the like.

The diameter of each of the patterned holes 23H formed in the resist film 23 and the openings 21H in the metal mask 21M is a diameter corresponding to a diameter of a short circuit part 18c in each of the electrode structures 17 to be formed.

Figure 9:
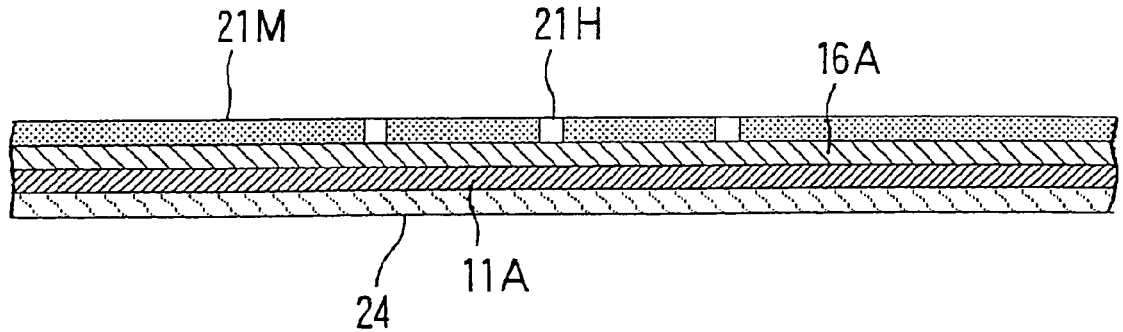
FIG. 9 is a cross-sectional view illustrating a state that the resist film has been removed from the metal mask.
Figure 10:
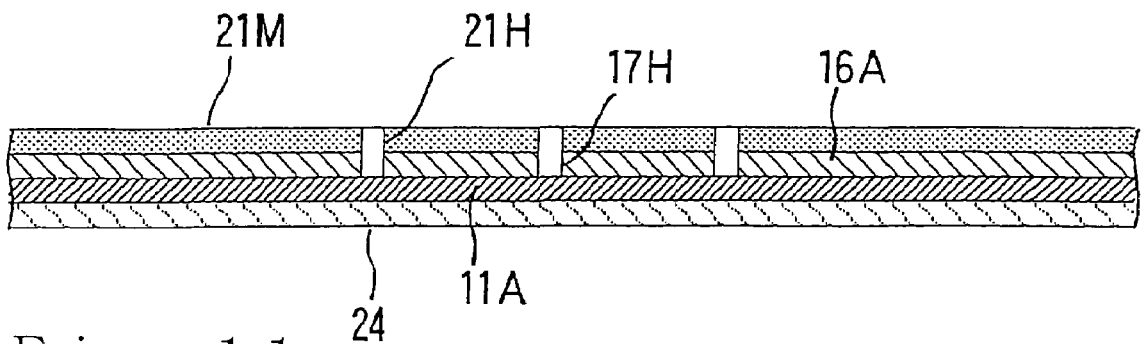
FIG. 10 is a cross-sectional view illustrating a state that the metal mask have been removed from a sheet for forming insulating films.

As illustrated in FIG. 9, the resist film is then removed from the surface of the metal mask 21M, and the sheet 16A for forming insulating films is then subjected to laser beam machining through the opening 21H in the metal mask 21M, whereby a plurality of through-holes 17H each having a diameter fitted to the diameter of the short circuit part 18c in the electrode structure 17 to be formed are formed in the sheet 16A for forming insulating films in accordance with the pattern corresponding to the pattern of the electrode structures 17 to be formed as illustrated in FIG. 10.

Figure 11:
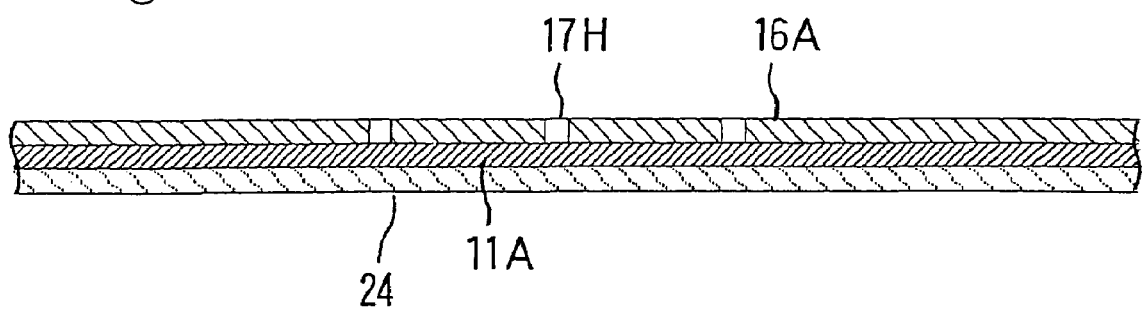
FIG. 11 is a cross-sectional view illustrating a state that through-holes for forming electrode structures have been formed in the sheet for forming insulating films.
Figure 12:
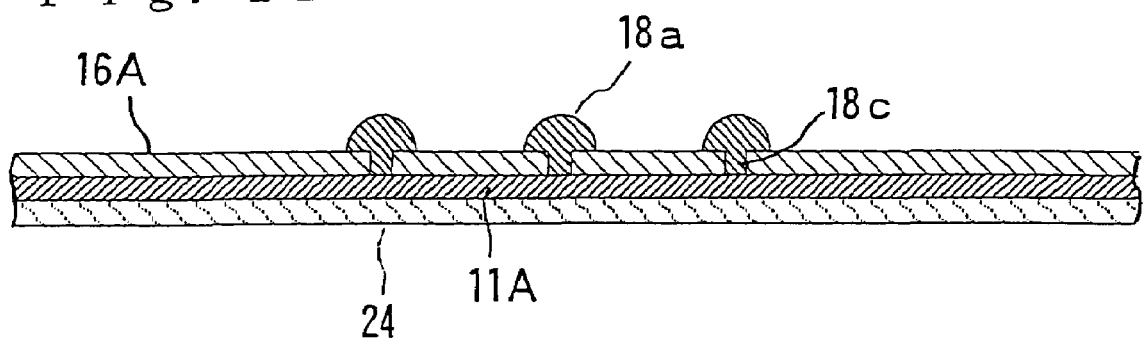
FIG. 12 is a cross-sectional view illustrating a state that short circuit parts and front-surface electrode parts have been formed in and on the sheet for forming insulating films.
Figure 13:
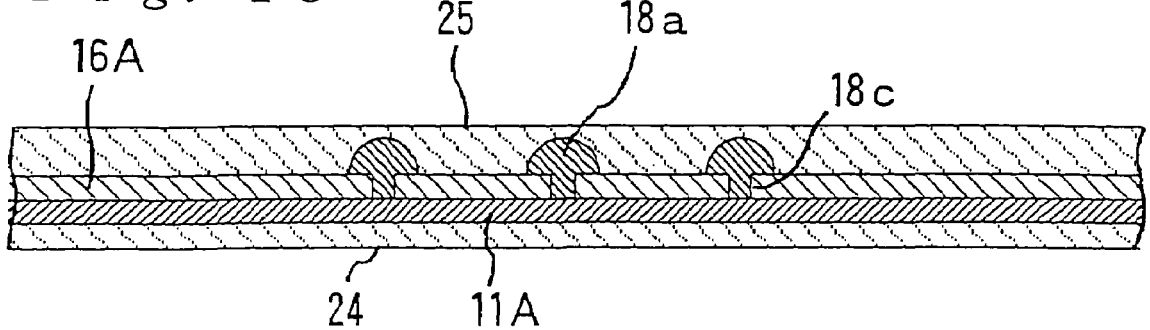
FIG. 13 is a cross-sectional view illustrating a state that a resist film has been formed so as to cover the sheet for forming insulating films and the front-surface electrode parts.
Figure 14:
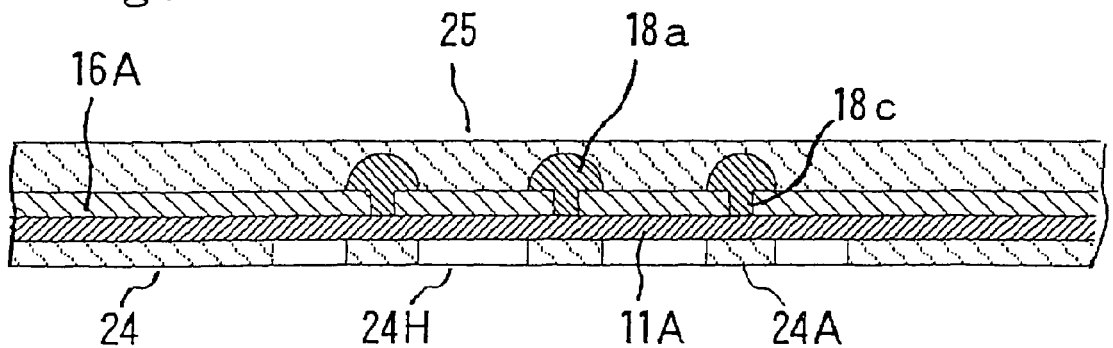
FIG. 14 is a cross-sectional view illustrating a state that patterned holes have been formed in the resist film formed on the metal plate for forming a frame plate.

As illustrated in FIG. 11, the metal mask is then removed from the sheet 16A for forming insulating films by an etching treatment, and the laminate material 20 is subjected to a plating treatment, thereby respectively forming short circuit parts 18c integrally linked to the metal plate 11A for forming a frame plate within the through-holes 17H in the resin sheet 16A for forming insulating films and at the same time, forming projected (semi-spherical) front-surface electrode parts 18a integrally linked to the respective short circuit parts 18c on the surface of the resin sheet 16A for forming insulating films as illustrated in FIG. 12. Thereafter, as illustrated in FIG. 13, a resist film 25 composed of a photoresist is formed so as to cover the resin sheet 16A for forming insulating films and the front-surface electrode parts 18a, and the resist film 24 formed on the metal plate 11A for forming a frame plate is then subjected to patterning so as to leave a portion corresponding to a frame plate 11 to be formed and portions corresponding to back-surface electrode parts 18b in the electrode structures 17 to be formed, thereby forming patterned holes 24H corresponding to through-holes 12 in a frame plate 11 to be formed in the resist film 24 and at the same time, forming resist patterns 24A corresponding to the back-surface electrode parts 18b to be formed in the respective patterned holes 24H as illustrated in FIG. 14.

Figure 15:
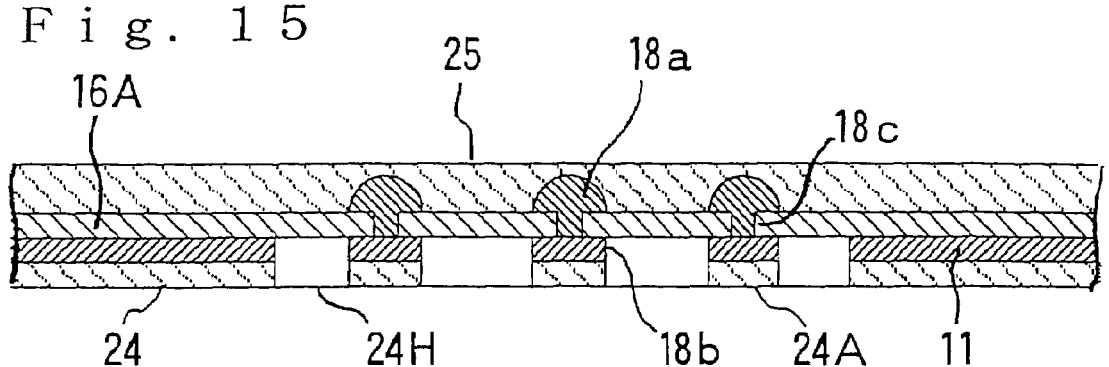
FIG. 15 is a cross-sectional view illustrating a state that the metal plate for forming a frame plate has been subjected to an etching treatment to form a frame plate and back-surface electrode parts.

The metal plate 11A for forming a frame plate is then subjected to an etching treatment to remove a part thereof, thereby forming a frame plate 11, in which through-holes 15 and positioning holes (not illustrated) have been formed, and at the same time, forming back-surface electrode parts 18b linked to the short circuit parts 18c by a part of the metal plate for forming the frame plate as illustrated in FIG. 15.

Figure 16:
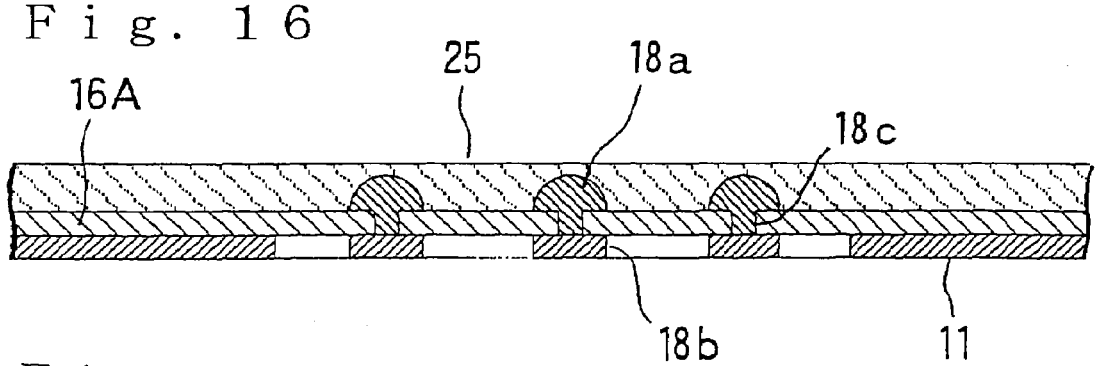
FIG. 16 is a cross-sectional view illustrating a state that the resist film has been removed from the frame plate.
Figure 17:
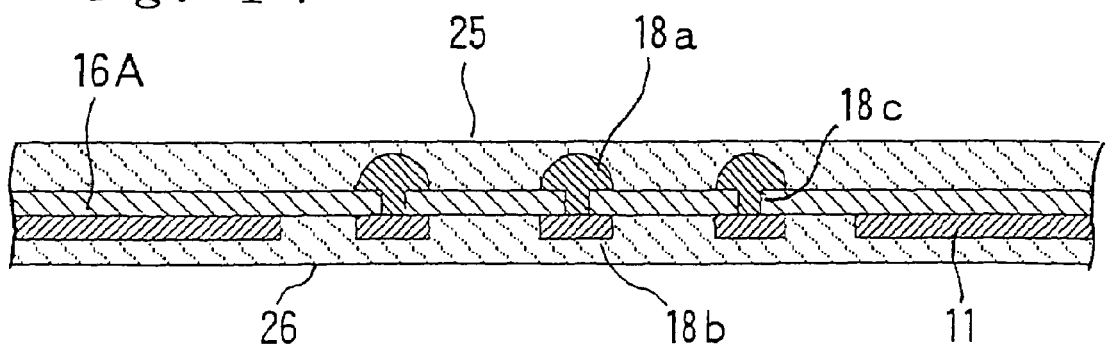
FIG. 17 is a cross-sectional view illustrating a state that a resist film has been formed so as to cover the surfaces of the frame plate, the sheet for forming insulating films and the back-surface electrode parts.
Figure 18:
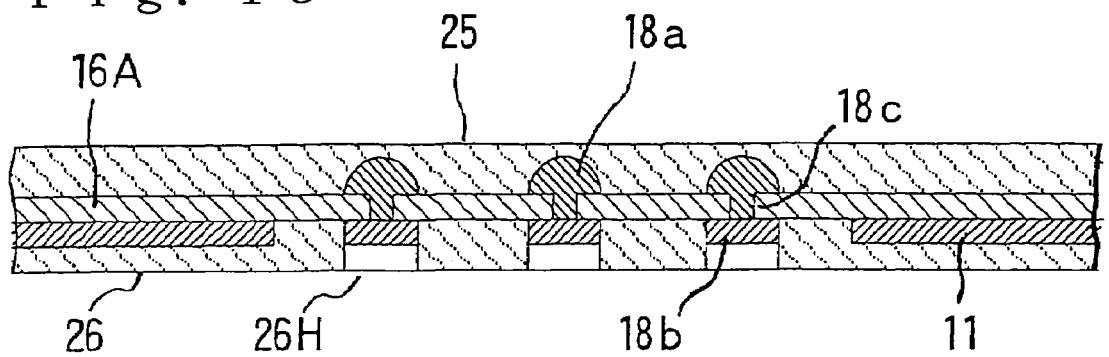
FIG. 18 is a cross-sectional view illustrating a state that patterned holes have been formed in the resist film formed in FIG. 17.
Figure 19:
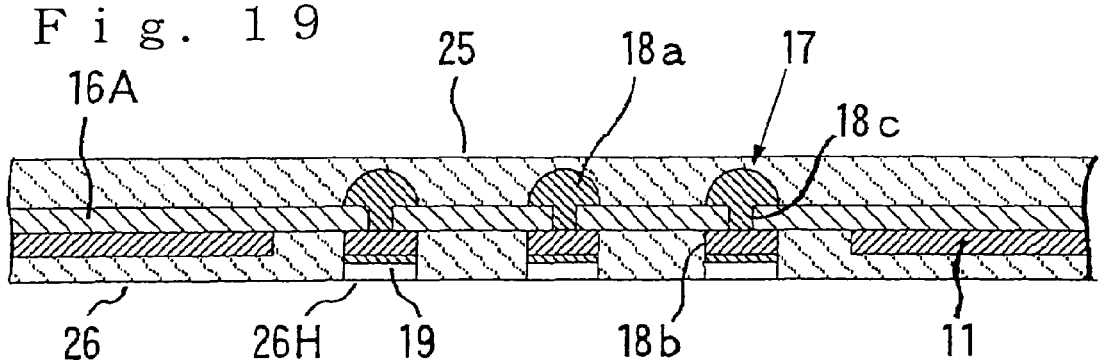
FIG. 19 is a cross-sectional view illustrating a state that coating films have been formed on the back-surface electrode parts.
Figure 20:
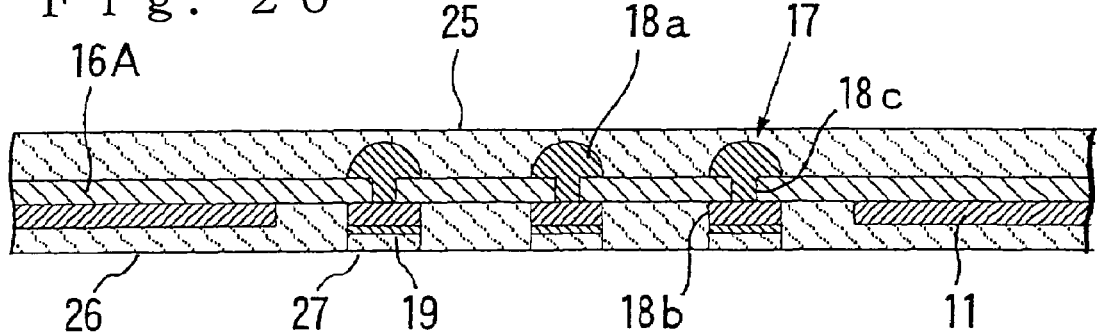
FIG. 20 is a cross-sectional view illustrating a state that resist films have been formed on the coating films.

As illustrated in FIG. 16, the resist film is then removed from the frame plate 11 and the back-surface electrode parts 18b respectively. Thereafter, a resist film 26 composed of a photoresist is formed so as to cover the frame plate 11, the sheet 16A for forming insulating films and the back-surface electrode parts 18b as illustrated in FIG. 17, and patterned holes 26H are then formed at portions, on which the back-surface electrode parts 18b are located, in this resist film 26 as illustrated in FIG. 18. The back-surface electrode parts 18b are then subjected to a plating treatment with a high-conductive metal, thereby forming coating films 19 on the back-surface electrode parts 18b as illustrated in FIG. 19, thus forming electrode structures 17. As needed, resist films 27 are then formed so as to cover the coating films 19 as illustrated in FIG. 20.

Figure 21:
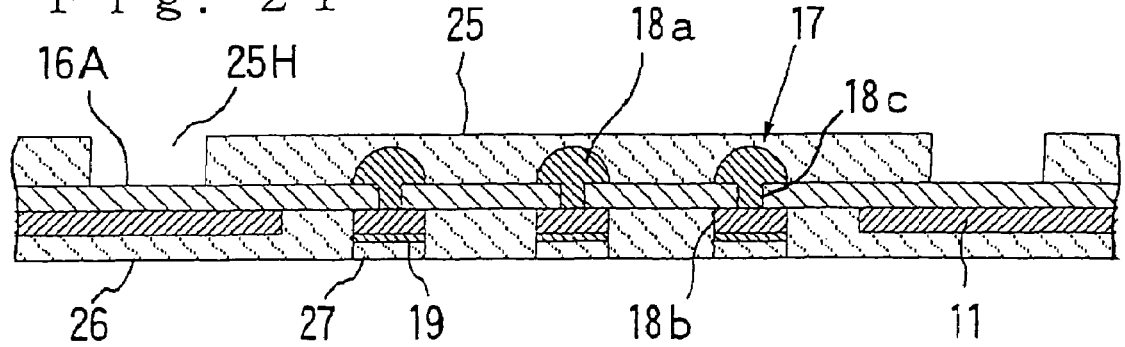
FIG. 21 is a cross-sectional view illustrating a state that patterned grooves have been formed in the resist film formed on the surfaces of the sheet for forming insulating films and the front-surface electrode parts.
Figure 22:
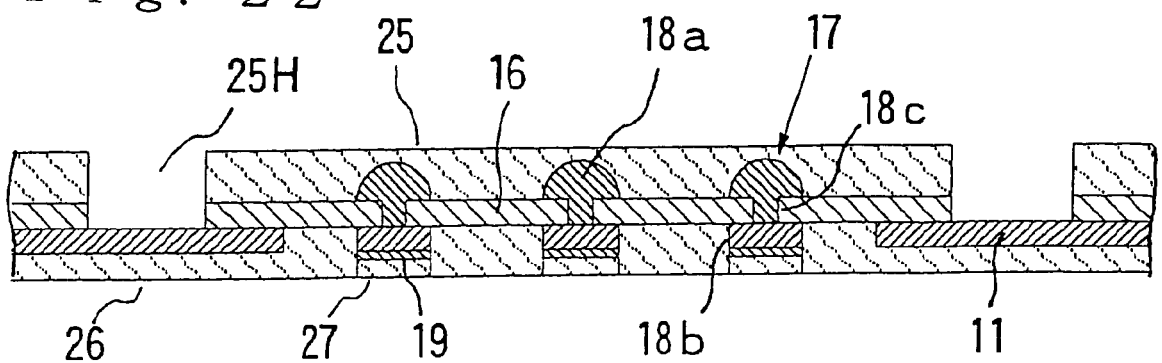
FIG. 22 is a cross-sectional view illustrating a state that the sheet for forming insulating films has been subjected to an etching treatment to form a plurality of insulating films.

The resist film 25 is then subjected to patterning so as to leave portions corresponding to contact films 15 to be formed, thereby forming patterned grooves 25H in the resist film 26 as illustrated in FIG. 21, and the sheet 16A for forming insulating films is subjected to an etching treatment to remove a part thereof, thereby forming a plurality of insulating films 16 independent of each other as illustrated in FIG. 22, thus forming a plurality of contact films 15 each formed by arranging, in each of the insulating film 16, a plurality of electrode structures 17 extending through in a thickness-wise direction thereof.

The resist films 25, 26 and 27 are then removed from the frame plate 11 and the contact films 15, and the protecting tape 22 (see FIG. 5) is removed from the frame plate 11, thereby obtaining the sheet-like probe according to the first embodiment, which is illustrated in FIGS. 1 to 3.

According to such a sheet-like probe 10, the plurality of the through-holes 12 are formed in the frame plate 11 corresponding to the electrode region, in which the electrodes to be inspected have been formed, of the wafer, which is the object of inspection, the contact films 15 arranged in the respective through-holes 12 may be small in area, and each of the contact films 15 small in area is little in the absolute quantity of thermal expansion in a plane direction of the insulating film 16 thereof, so that the thermal expansion of the insulating film 16 can be surely restrained by the frame plate 11. Accordingly, in a burn-in test, positional deviation between the electrode structures 17 and the electrodes to be inspected by temperature changes can be surely prevented even when the wafer, which is the object of inspection, has a large area of 8 inches or greater in diameter, and the pitch of the electrodes to be inspected is extremely small. As a result, a good electrically connected state to the wafer can be stably retained.

Figure 23:
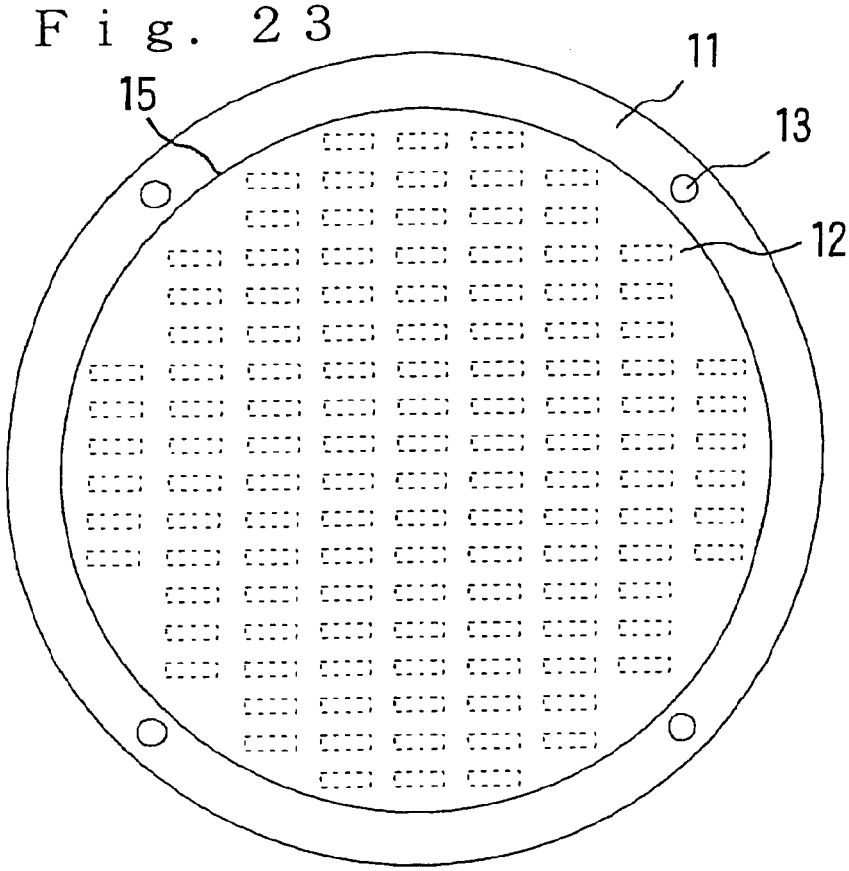
FIG. 23 is a plan view illustrating a sheet-like probe according to a second embodiment of the present invention.
Figure 24:
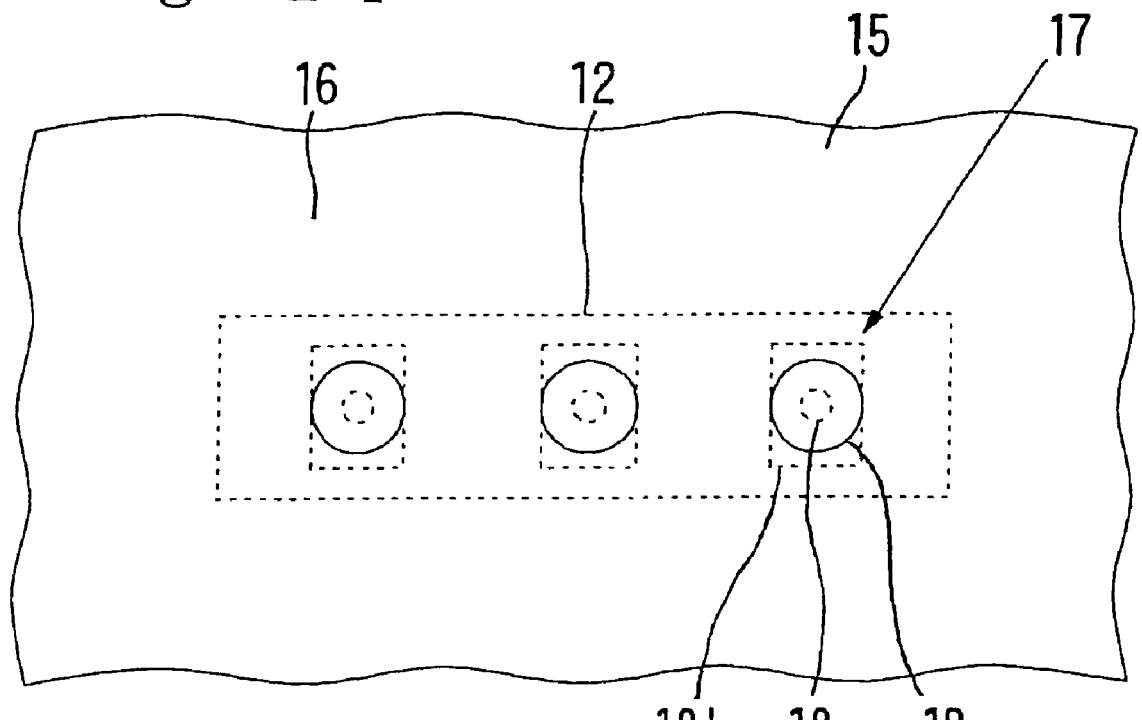
FIG. 24 is a plan view illustrating, on an enlarged scale, a principal part of a contact film in the sheet-like probe according to the second embodiment.
Figure 25:
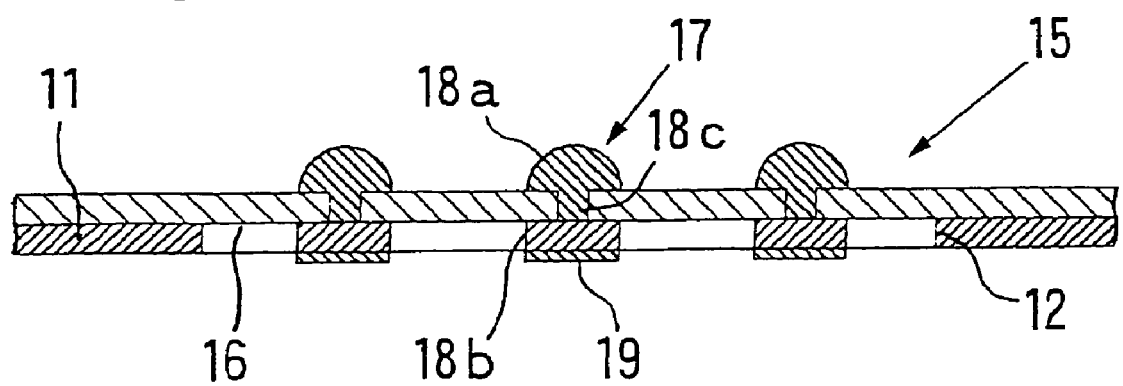
FIG. 25 is a cross-sectional view illustrating, on an enlarged scale, the construction of a principal part of the sheet-like probe according to the second embodiment.

FIG. 23 is a plan view illustrating a sheet-like probe according to a second embodiment of the present invention, FIG. 24 is a plan view illustrating, on an enlarged scale, a principal part of a contact film in the sheet-like probe according to the second embodiment, and FIG. 25 is a cross-sectional view illustrating, on an enlarged scale, a principal part of the sheet-like probe according to the second embodiment.

The sheet-like probe 10 according to the second embodiment is used to conduct, on a wafer, on which, for example, a plurality of integrated circuits have been formed, electrical inspection as to each of the integrated circuits in a state of the wafer, and has a frame plate 11 (see FIG. 4) of the same construction as in the sheet-like probe 10 according to the first embodiment.

On one surface of this frame plate 11, a single circular contact film 15 having a diameter smaller than the diameter of the frame plate 11 is provided integrally with the frame plate 11 and supported thereby.

This contact film 15 has a flexible insulating film 16, and a plurality of electrode structures 17 extending in a thickness-wise direction of the insulating film 16 are arranged in the insulating film 16 in relation separated from each other in a plane direction of the insulating film 16 and in accordance with a pattern corresponding to a pattern of electrodes to be inspected in the wafer that is the object of inspection. The contact film 15 is arranged in such a manner that the each of electrode structures 17 are located within the respective through-holes 12 of the frame plate 11.

Each of the electrode structures 17 is formed by integrally linking a projected front-surface electrode part 18a exposed to a front surface of the insulating film 16 and a plate-like back-surface electrode part 18b exposed to a back surface of the insulating film 16 to each other through a short circuit part 18c extending through in the thickness-wise direction of the insulating film 16. In this embodiment, a coating film 19 formed of a high-conductive metal is formed on the back-surface electrode part 18b.

In the sheet-like probe 10 of the second embodiment, a material of the insulating film 16, and a material, dimensions and the like of the electrode structures 17 are the same as those in the sheet-like probe according to the first embodiment.

The sheet-like probe 10 according to the second embodiment can be produced in the same manner as in the sheet-like probe according to the first embodiment except that in the above-described production process of the sheet-like probe 10 according to the first embodiment, the sheet 16A for forming insulating films is used as the insulating film 16 as it is without conducting the etching treatment of the sheet 16A for forming insulating films.

According to such a sheet-like probe 10 of the second embodiment, the plurality of the through-holes 12 are formed in the frame plate 11 corresponding to the electrode region, in which the electrodes to be inspected have been formed, of the circuit device, which is the object of inspection, and the contact film 15 is arranged on the frame plate 11 in such a manner that each of the electrode structures 17 is located in the respective through-holes 12 in the frame plate 11, whereby the contact film 15 is supported over the whole surface thereof by the frame plate 11, so that the thermal expansion of the insulating film 16 in the plane direction thereof can be surely restrained by the frame plate 11 even when the contact film 15 has a large area. Accordingly, in a burn-in test, positional deviation between the electrode structures 17 and the electrodes to be inspected by temperature changes can be surely prevented even when the wafer, which is the object of inspection, has a large area of, for example, 8 inches or greater in diameter, and the pitch of the electrodes to be inspected is extremely small. As a result, a good electrically connected state to the wafer can be stably retained.

Figure 26:
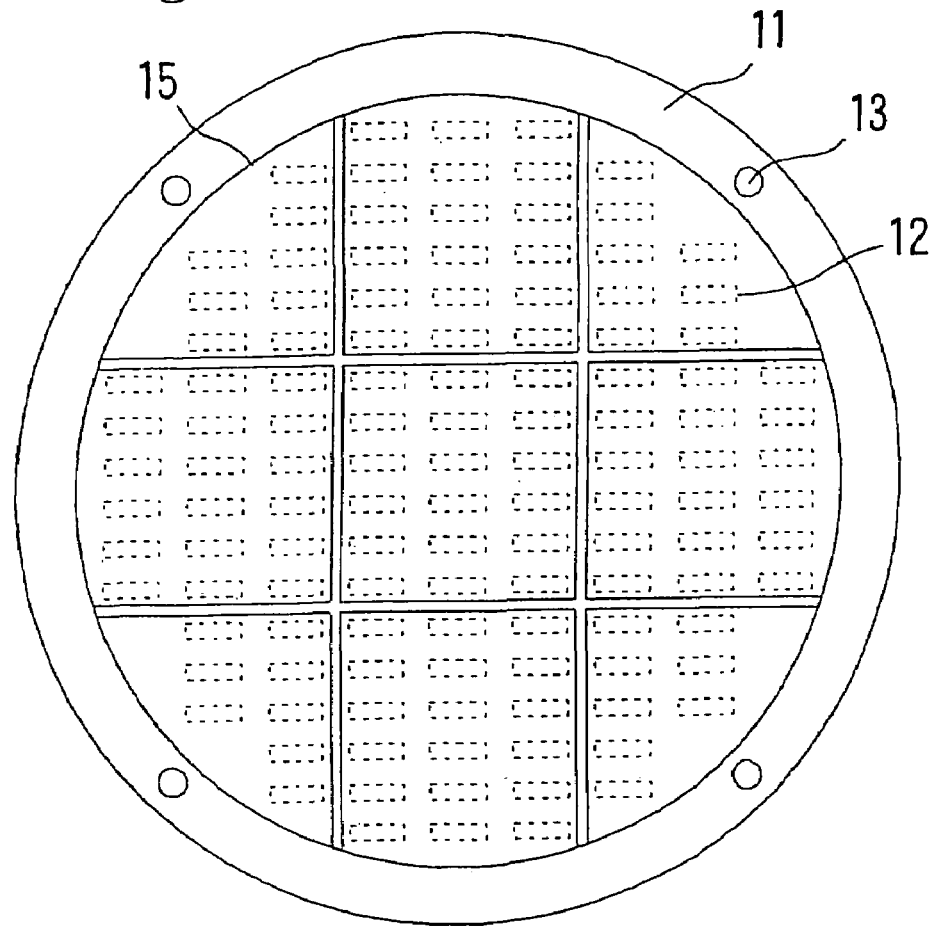
FIG. 26 is a plan view illustrating a sheet-like probe according to a third embodiment of the present invention.
Figure 27:
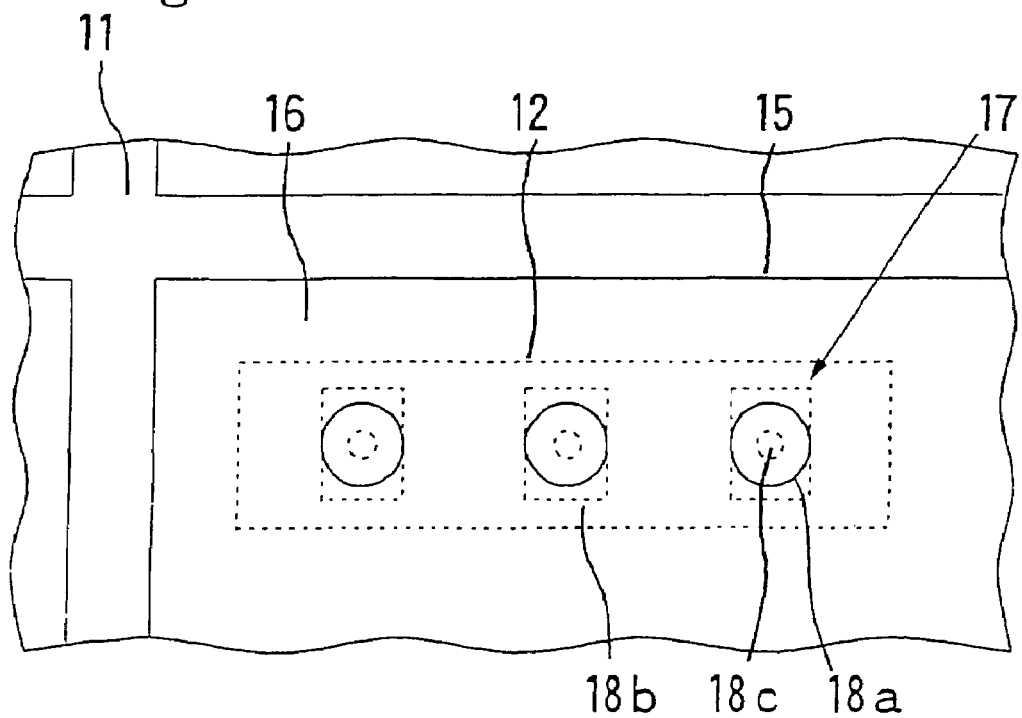
FIG. 27 is a plan view illustrating, on an enlarged scale, a principal part of a contact film in the sheet-like probe according to the third embodiment.
Figure 28:
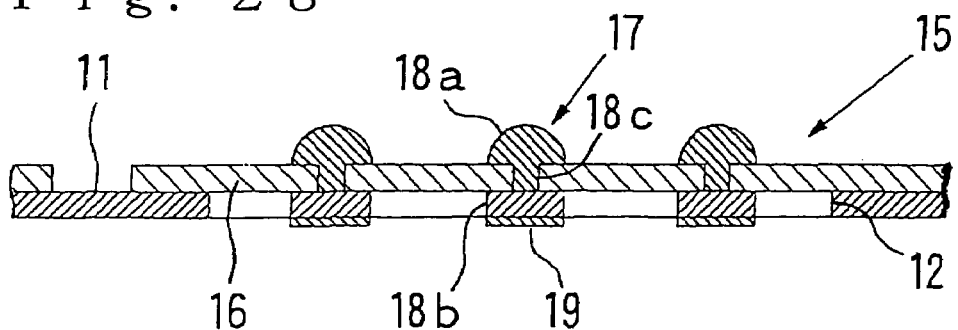
FIG. 28 is a cross-sectional view illustrating, on an enlarged scale, the construction of a principal part of the sheet-like probe according to the third embodiment.

FIG. 26 is a plan view illustrating a sheet-like probe according to a third embodiment of the present invention, FIG. 27 is a plan view illustrating, on an enlarged scale, a principal part of a contact film in the sheet-like probe according to the third embodiment, and FIG. 28 is a cross-sectional view illustrating, on an enlarged scale, a principal part of the sheet-like probe according to the third embodiment.

The sheet-like probe 10 according to the third embodiment is used to conduct, on a wafer, on which, for example, a plurality of integrated circuits have been formed, electrical inspection as to each of the integrated circuits in a state of the wafer, and has a frame plate 11 (see FIG. 4) of the same construction as in the sheet-like probe 10 according to the first embodiment.

On one surface of this frame plate 11, a plurality (9 films in the illustrated embodiment) of contact films 15 arranged in a state independent of each other so as to align along the surface of the frame plate are provided integrally with the frame plate 11 and supported thereby.

Each of the contact films 15 has a flexible insulating film 16, and a plurality of electrode structures 17 extending in a thickness-wise direction of the insulating film 16 are arranged in the insulating film 16 in relation separated from each other in a plane direction of the insulating film 16 and in accordance with a pattern corresponding to a pattern of electrodes to be inspected in the wafer that is the object of inspection. The contact film 15 is arranged in such a manner that each of the electrode structures 17 is located within the respective through-holes 12 in the frame plate 11.

Each of the electrode structures 17 is formed by integrally linking a projected front-surface electrode part 18a exposed to a front surface of the insulating film 16 and a plate-like back-surface electrode part 18b exposed to a back surface of the insulating film 16 to each other through a short circuit part 18c extending through in the thickness-wise direction of the insulating film 16. In this embodiment, a coating film 19 formed of a high-conductive metal is formed on the back-surface electrode part 18b.

In the sheet-like probe 10 of the third embodiment, a material of the insulating films 16, and a material, dimensions and the like of the electrode structures 17 are the same as those in the sheet-like probe according to the first embodiment.

The sheet-like probe 10 according to the third embodiment can be produced in the same manner as in the sheet-like probe 10 according to the first embodiment.

According to such a sheet-like probe 10 of the third embodiment, the plurality of the through-holes 12 are formed in the frame plate 11 corresponding to the electrode region, in which the electrodes to be inspected have been formed, of the circuit device, which is the object of inspection, and the plurality of the contact films 15 independent of each other are arranged on the frame plate 11 in such a manner that each of the electrode structures 17 are located in the respective through-holes 12 of the frame plate 11, whereby the contact films 15 is supported over the whole surface thereof by the frame plate 11, so that the thermal expansion of the insulating film 16 in the plane direction thereof can be surely restrained by the frame plate 11 even when the contact film 15 has a large area. Accordingly, in a burn-in test, positional deviation between the electrode structures 17 and the electrodes to be inspected by temperature changes can be surely prevented even when the wafer, which is the object of inspection, has a large area of, for example, 8 inches or greater in diameter, and the pitch of the electrodes to be inspected is extremely small. As a result, a good electrically connected state to the wafer can be stably retained.

<Probe Card>

Figure 29:
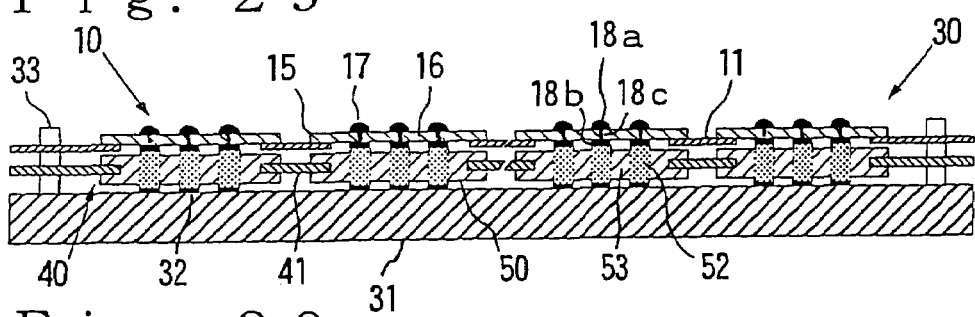
FIG. 29 is a cross-sectional view illustrating the construction of a probe card according to a first embodiment of the present invention.
Figure 30:
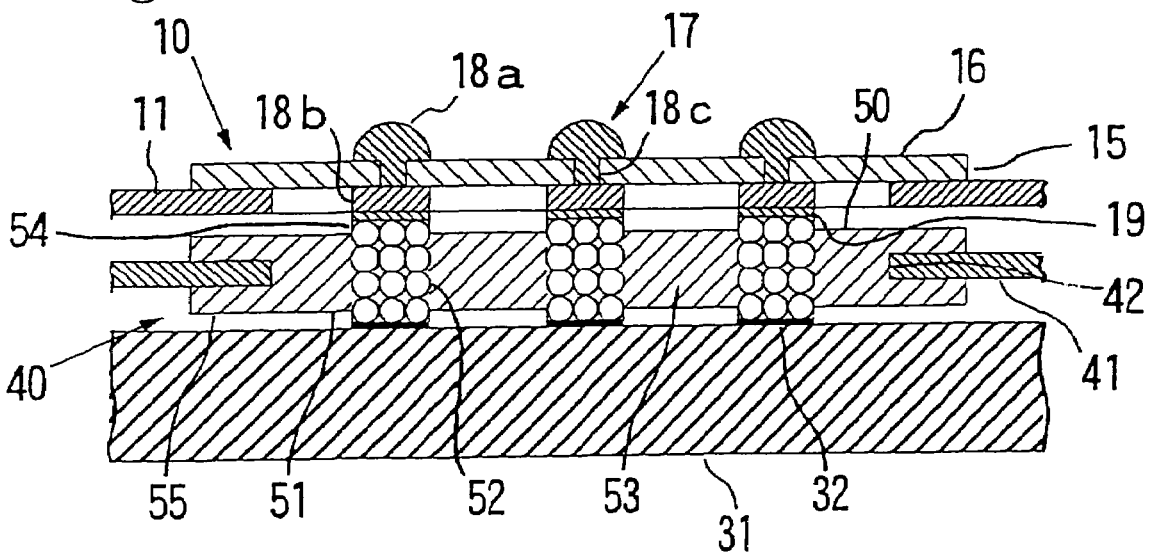
FIG. 30 is a cross-sectional view illustrating, on an enlarged scale, the construction of a principal part of the probe card according to the first embodiment.

FIG. 29 is a cross-sectional view illustrating the construction of a probe card according to a first embodiment of the present invention, and FIG. 30 is a cross-sectional view illustrating the construction of a principal part of the probe card according to the first embodiment.

The probe card 30 according to the first embodiment is used to conduct, on a wafer, on which, for example, a plurality of integrated circuits have been formed, electrical inspection as to each of the integrated circuits in a state of the wafer, and is made up by a circuit board 31 for inspection, an anisotropically conductive connector 40 arranged on one surface of the circuit board 31 for inspection, and the sheet-like probe 10 according to the first embodiment, which is provided on the anisotropically conductive connector 40.

The circuit board 31 for inspection has guide pins 33 for positioning the anisotropically conductive connector 40 and the sheet-like probe 10, and on one surface of the circuit board 31 for inspection, a plurality of inspection electrodes 32 are formed in accordance with a pattern corresponding to a pattern of electrode to be inspected in all integrated circuits formed on a wafer, which is an object of inspection.

As a board material for forming the circuit board 31 for inspection, may be used any of conventionally known various board materials, and specific examples thereof include composite resin board materials such as glass fiber-reinforced epoxy resins, glass fiber-reinforced phenol resins, glass fiber-reinforced polyimide resins and glass fiber-reinforced bismaleimide triazine resins, ceramic board materials such as glass, silicon dioxide and alumina, and laminated board materials obtained by using a metal plate as a core material and laminating a resin such as an epoxy resin or polyimide resin thereon.

When a probe card to be used in a burn-in test is constructed, that having a coefficient of linear thermal expansion of preferably at most $3\times10^{-5}$/K, more preferably $1\times10^{-7}$ to $1\times10^{-5}$/K, particularly preferably $1\times10^{-6}$ to $6\times10^{-6}$/K is used.

Specific examples of such a board material include inorganic board materials composed of Pyrex (Registered trademark) glass, quartz glass, alumina, berylliua, silicon carbide, aluminum nitride, boron nitride or the like, and laminated board materials obtained by using a metal plate formed of an iron-nickel alloy steel such as 42 alloy, covar or invar as a core material and laminating a resin such as an epoxy resin or polyimide resin thereon.

Figure 31:
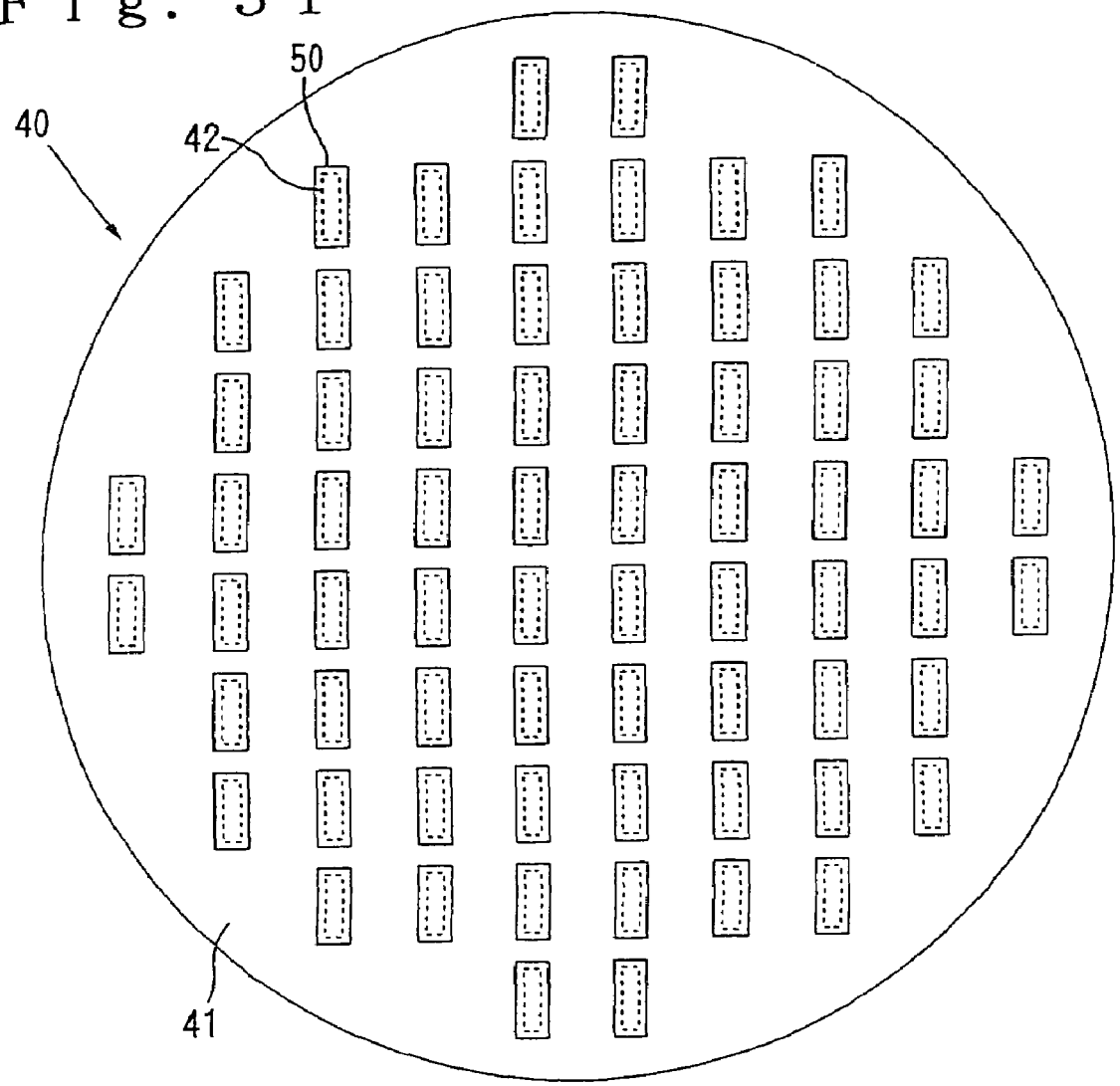
FIG. 31 is a plan view illustrating an anisotropically conductive connector in the probe card according to the first embodiment.

As illustrated in FIG. 31, the anisotropically conductive connector 40 has a circular frame plate 41, in which a plurality of anisotropically conductive film-arranging holes 42 each extending though in a thickness-wise direction of the frame plate have been formed. The anisotropically conductive film-arranging holes 42 in this frame plate 41 are formed corresponding to a pattern of an electrode region, in which electrodes to be inspected have been formed, in all integrated circuits formed on a wafer, which is an object of inspection. In each of the anisotropically conductive film-arranging holes 42 in the frame plate 41, an anisotropically conductive film 50 having conductivity in a thickness-wise direction thereof is arranged in a state supported by a peripheral portion about the anisotropically conductive film-arranging hole 42 in the frame plate 41 and in a state independent of adjoining anisotropically conductive films 50. In the frame plate 41 of this embodiment, positioning holes (not illustrated) for conducting positioning to the sheet-like probe 10 and the circuit board 31 for inspection are formed.

Each of the elastic anisotropically conductive films 50 is formed of an elastic polymeric substance as a base material and has a functional part 51 composed of a plurality of conductive parts 52 for connection extending in a thickness-wise direction of the film and an insulating part 53 formed around each of the conductive parts 52 for connection and mutually insulating the conductive parts 52 for connection. The functional part 51 is arranged so as to be located in the anisotropically conductive film-arranging hole 42 in the frame plate 41. The conductive parts 52 for connection in the functional part 51 are arranged in accordance with the pattern corresponding to the pattern of the electrodes to be inspected of the electrode region in the integrated circuit formed on the wafer, which is the object of inspection.

At a peripheral edge of the functional part 51, a part 55 to be supported, which is fixed and supported by a peripheral portion of the anisotropically conductive film-arranging hole 42 in the frame plate 41, is formed integrally and continuously with the functional part 51. More specifically, the part 55 to be supported in this embodiment is shaped in a forked form and fixed and supported in a closely contacted state so as to grasp the peripheral portion about the anisotropically conductive film-arranging hole 42 in the frame plate 41.

In the conductive parts 52 for connection in the functional part 51 of the elastic anisotropically conductive film 50, conductive particles P exhibiting magnetism are contained at a high density in a state oriented so as to align in the thicknesswise direction. On the other hand, the insulating part 53 does not contain the conductive particles P at all or scarcely contain them.

In the illustrated embodiment, projected portions 54 protruding from other surfaces than portions, at which the conductive parts 52 and peripheral portions thereof are located, are formed at those portions on both surfaces of the functional part 51 in the anisotropically conductive film 50.

The thickness of the frame plate 41 varies according to the material thereof, but is preferably 20 to 600 μm, more preferably 40 to 400 μm.

If this thickness is smaller than 20 μm, the strength required upon use of the resulting anisotropically conductive connector 40 is not achieved, and the durability thereof is liable to be lowered. In addition, such stiffness as the form of the frame plate 41 is retained is not achieved, and the handling property of the anisotropically conductive connector 40 becomes low. If the thickness exceeds 600 μm on the other hand, the elastic anisotropically conductive films 50 formed in the anisotropically conductive film-arranging holes 42 become too great in thickness, and it may be difficult in some cases to achieve good conductivity in the conductive parts 52 for connection and insulating property between adjoining conductive parts 52 for connection.

The form and size in a plane direction of the anisotropically conductive film-arranging holes 42 in the frame plate 41 are designed according to the size, pitch and pattern of electrodes to be inspected in a wafer that is an object of inspection.

No particular limitation is imposed on a material for forming the frame plate 41 so far as it has such stiffness as the resulting frame plate 41 is hard to be deformed, and the form thereof is stably retained. For example, various kinds of materials such as metallic materials, ceramic materials and resin materials may be used. When the frame plate 41 is formed by, for example, a metallic material, an insulating film may be formed on the surface of the frame plate 41.

Specific examples of the metallic material for forming the frame plate 41 include metals such as iron, copper, nickel, titanium and aluminum, and alloys or alloy steels composed of a combination of at least two of these metals.

When the probe card 30 is used in a burn-in test, it is preferable to use a material having a coefficient of linear thermal expansion of at most $3 \times 10^{-5}$/K, more preferably $-1 \times 10^{-7}$ to $1 \times 10^{-5}$/K, particularly preferably $1 \times 10^{-6}$ to $8 \times 10^{-6}$/K as a material for forming the frame plate 41.

Specific examples of such a material include invar alloys such as invar, Elinvar alloys such as Elinvar, and alloys or alloy steels of magnetic metals, such as superinvar, covar and 42 alloy.

The overall thickness (thickness of the conductive part 52 for connection in the illustrated embodiment) of the elastic anisotropically conductive film 50 is preferably 50 to 3,000 μm, more preferably 70 to 2,500 μm, particularly preferably 100 to 2,000 μm. When this thickness is 50 μm or greater, elastic anisotropically conductive films 50 having sufficient strength are provided with certainty. When this thickness is 3,000 μm or smaller on the other hand, conductive parts 52 for connection having necessary conductive properties are provided with certainty.

The projected height of the projected parts 54 is preferably at least 10% in total of the thickness of the projected parts 54, more preferably at least 20%. Projected parts 54 having such a projected height are formed, whereby the conductive parts 52 for connection are sufficiently compressed by small pressurizing force, so that good conductivity is surely achieved.

The projected height of the projected part 54 is preferably at most 100%, more preferably at most 70% of the shortest width or diameter of the projected part 54. Projected parts 54 having such a projected height are formed, whereby the projected parts 54 are not buckled when they are pressurized, so that the expected conductivity is surely achieved.

The thickness (thickness of one of the forked portions in the illustrated embodiment) of the part 55 to be supported is preferably 5 to 600 μm, more preferably 10 to 500 μm, particularly preferably 20 to 400 μm.

It is not essential for the part 55 to be supported to be formed in the forked form, and it may be fixed to only one surface of the frame plate 41.

The elastic polymeric substance forming the anisotropically conductive films 50 is preferably a heat-resistant polymeric substance having a crosslinked structure. Various materials may be used as curable polymeric substance-forming materials usable for obtaining such a crosslinked polymeric substance. Specific examples thereof include silicone rubber; conjugated diene rubbers such as polybutadiene rubber, natural rubber, polyisoprene rubber, styrene-butadiene copolymer rubber and acrylonitrile-butadiene copolymer rubber, and hydrogenated products thereof; block copolymer rubbers such as styrene-butadiene-diene block terpolymer rubber and styrene-isoprene block copolymers, and hydrogenated products thereof; and chloroprene, urethane rubber, polyester rubber, epichlorohydrin rubber, ethylene-propylene copolymer rubber, ethylene-propylene-diene terpolymer rubber and soft liquid epoxy rubber.

Among these, silicone rubber is preferred from the viewpoints of molding and processing ability and electrical properties.

As the silicone rubber, is preferred that obtained by crosslinking or condensing liquid silicone rubber. The liquid silicone rubber preferably has a viscosity not higher than $10^5$ poises as measured at a shear rate of $10^{-1}$ sec and may be any of condensation type, addition type and those containing a vinyl group or hydroxyl group. As specific examples thereof, may be mentioned dimethyl silicone raw rubber, methylvinyl silicone raw rubber and methylphenylvinyl silicone raw rubber.

Among these, vinyl group-containing liquid silicone rubber (vinyl group-containing dimethyl polysiloxane) is generally obtained by subjecting dimethyldichlorosilane or dimethyldialkoxysilane to hydrolysis and condensation reaction in the presence of dimethylvinylchlorosilane or dimethylvinylalkoxysilane and then fractionating the reaction product by, for example, repeated dissolution-precipitation.

Liquid silicone rubber having vinyl groups at both terminals thereof is obtained by subjecting a cyclic siloxane such as octamethylcyclotetrasiloxane to anionic polymerization in the presence of a catalyst, using, for example, dimethyldivinylsiloxane as a polymerization terminator and suitably selecting other reaction conditions (for example, amounts of the cyclic siloxane and polymerization terminator). As the catalyst for the anionic polymerization used herein, may be used an alkali such as tetramethylammonium hydroxide or n-butyl-phosphonium hydroxide, or a silanolate solution thereof. The reaction is conducted at a temperature of, for example, 80 to 130° C.

Such a vinyl group-containing dimethyl polysiloxane preferably has a molecular weight Mw (weight average molecular weight as determined in terms of standard polystyrene equivalent; the same shall apply hereinafter) of 10,000 to 40,000. It also preferably has a molecular weight distribution index (a ratio Mw/Mn of weight average molecular weight Mw as determined in terms of standard polystyrene equivalent to number average molecular weight Mn as determined in terms of standard polystyrene equivalent; the same shall apply hereinafter) of at most 2 from the viewpoint of the heat resistance of the resulting elastic anisotropically conductive films 50.

On the other hand, hydroxyl group-containing liquid silicone rubber (hydroxyl group-containing dimethyl polysiloxane) is generally obtained by subjecting dimethyldichlorosilane or dimethyldialkoxysilane to hydrolysis and condensation reaction in the presence of dimethylhydrochlorosilane or dimethylhydroalkoxysilane and then fractionating the reaction product by, for example, repeated dissolution-precipitation.

The hydroxyl group-containing liquid silicone rubber is also obtained by subjecting a cyclic siloxane to anionic polymerization in the presence of a catalyst, using, for example, dimethylhydrochlorosilane, methyldihydrochlorosilane or dimethylhydroalkoxysilane as a polymerization terminator and suitably selecting other reaction conditions (for example, amounts of the cyclic siloxane and polymerization terminator). As the catalyst for the anionic polymerization, may be used an alkali such as tetramethylammonium hydroxide or n-butylphosphonium hydroxide or a silanolate solution thereof. The reaction is conducted at a temperature of, for example, 80 to 130° C.

Such a hydroxyl group-containing dimethyl polysiloxane preferably has a molecular weight Mw of 10,000 to 40,000. It also preferably has a molecular weight distribution index of at most 2 from the viewpoint of the heat resistance of the resulting elastic anisotropically conductive films 50.

In the present invention, either one of the above-described vinyl group-containing dimethyl polysiloxane or hydroxyl group-containing dimethyl polysiloxane may be used, or both may also be used in combination.

A curing catalyst for curing the polymeric substance-forming material may be contained in the polymeric substance-forming material. As such a curing catalyst, may be used an organic peroxide, fatty acid azo compound, hydrosilylation catalyst or the like.

Specific examples of the organic peroxide used as the curing catalyst include benzoyl peroxide, bisdicyclobenzoyl peroxide, dicumyl peroxide and di-tert-butyl peroxide.

Specific examples of the fatty acid azo compound used as the curing catalyst include azobisisobutyronitrile.

Specific examples of that used as the catalyst for hydrosilylation reaction include publicly known catalysts such as platinic chloride and salts thereof, platinum-unsaturated group-containing siloxane complexes, vinylsiloxane-platinum complexes, platinum-1,3-divinyltetramethyldisiloxane complexes, complexes of triorganophosphine or phosphine and platinum, acetyl acetate platinum chelates, and cyclic diene-platinum complexes.

The amount of the curing catalyst used is suitably selected in view of the kind of the polymeric substance-forming material, the kind of the curing catalyst and other curing treatment conditions. However, it is generally 3 to 15 parts by weight per 100 parts by weight of the polymeric substance-forming material.

As the conductive particles P contained in the conductive parts 52 for connection in the elastic anisotropically conductive films 50, those exhibiting magnetism are preferably used in that such conductive particles P can be easily moved in a molding material for forming the elastic anisotropically conductive films 50 in the formation of the elastic anisotropically conductive films 50. Specific examples of such conductive particles exhibiting magnetism include particles of metals exhibiting magnetism, such as iron, nickel and cobalt, particles of alloys thereof, particles containing such a metal, particles obtained by using these particles as core particles and plating surfaces of the core particles with a metal having good conductivity, such as gold, silver, palladium or rhodium, particles obtained by using particles of a non-magnetic metal, particles of an inorganic substance, such as glass beads, or particles of a polymer as core particles and plating surfaces of the core particles with a conductive magnetic substance such as nickel or cobalt, and particles obtained by coating the core particles with both conductive magnetic substance and good-conductive metal.

Among these, particles obtained by using nickel particles as core particles and plating their surfaces with a metal having good conductivity, such as gold or silver are preferably used.

No particular limitation is imposed on a means for coating the surfaces of the core particles with the conductive metal. However, for example, the coating may be conducted by electroless plating.

When those obtained by coating the surfaces of the core particles with the conductive metal are used as the conductive particles P, the coating rate (proportion of an area coated with the conductive metal to the surface area of the core particles) of the conductive metal on the particle surfaces is preferably at least 40%, more preferably at least 45%, particularly preferably 47 to 95% from the viewpoint of achieving good conductivity.

The amount of the conductive metal to be coated is preferably 2.5 to 50% by weight, more preferably 3 to 45% by weight, still more preferably 3.5 to 40% by weight, particularly preferably 5 to 30% by weight based on the core particles.

The particle diameter of the conductive particles P is preferably 1 to 500 µm, more preferably 2 to 400 µm, still more preferably 5 to 300 µm, particularly preferably 10 to 150 µm.

The particle diameter distribution (Dw/Dn) of the conductive particles P is preferably 1 to 10, more preferably 1 to 7, still more preferably 1 to 5, particularly preferably 1 to 4.

Conductive particles P satisfying such conditions are used, whereby the resulting elastic anisotropically conductive films 50 become easy to deform under pressure, and sufficient electrical contact is achieved among the conductive particles P in the conductive parts 52 for connection in the elastic anisotropically conductive films 50.

Conductive particles P having such an average particle diameter can be prepared by subjecting conductive particles and/or core particles for forming the conductive particles to a classification treatment by means of a classifier such as an air classifier or sonic classifier. Specific conditions for the classification treatment are suitably preset according to the intended average particle diameter and particle diameter distribution of the conductive particles, the kind of the classifier, and the like.

No particular limitation is imposed on the shape of the conductive particles P. However, they are preferably in the shape of a sphere or star, or a mass of secondary particles obtained by agglomerating these particles from the viewpoint of permitting easy dispersion of these particles in the polymeric substance-forming material.

The water content in the conductive particles P is preferably at most 5%, more preferably at most 3%, still more preferably at most 2%, particularly preferably at most 1%. The use of the conductive particles P satisfying such conditions can prevent or inhibit the occurrence of bubbles in a molding material layer upon a curing treatment of the molding material layer.

Those obtained by treating surfaces of the conductive particles P with a coupling agent such as a silane coupling agent may be suitably used. By treating the surfaces of the conductive particles P with the coupling agent, the adhesion property of the conductive particles P to the elastic polymeric substance is improved, so that the resulting elastic anisotropically conductive films 50 become high in durability in repeated use.

The amount of the coupling agent used is suitably selected within limits not affecting the conductivity of the conductive particles P. However, it is preferably such an amount that a coating rate (proportion of an area coated with the coupling agent to the surface area of the conductive core particles) of the coupling agent on the surfaces of the conductive particles P amounts to at least 5%, more preferably 7 to 100%, further preferably 10 to 100%, particularly preferably 20 to 100%.

The proportion of the conductive particles P contained in the conductive parts 52 for connection in the functional part 51 is preferably 10 to 60%, more preferably 15 to 50% in terms of volume fraction. If this proportion is lower than 10%, conductive parts 52 for connection sufficiently low in electric resistance value may not be obtained in some cases. If the proportion exceeds 60% on the other hand, the resulting conductive parts 52 for connection are liable to be brittle, so that elasticity required of the conductive parts 52 for connection may not be achieved in some cases.

In the polymeric substance-forming material, as needed, may be contained an inorganic filler such as general silica powder, colloidal silica, aerogel silica or alumina. By containing such an inorganic filler, the thixotropic property of the resulting molding material is secured, the viscosity thereof becomes high, the dispersion stability of the conductive particles P is improved, and moreover the strength of the elastic anisotropically conductive films 50 obtained by a curing treatment becomes high.

No particular limitation is imposed on the amount of such an inorganic filler used. However, the use in a too large amount is not preferred because the movement of the conductive particles P by a magnetic field is greatly inhibited in a production process, which will be described subsequently.

Such an anisotropically conductive connector 40 can be produced in accordance with the process described in, for example, Japanese Patent Application Laid-Open No. 2002-334732.

In the probe card 30 according to the first embodiment, the guide pins 33 of the circuit board 31 for inspection are inserted, respectively, into the positioning holes (not illustrated) in the frame plate 41 in the anisotropically conductive connector 40 and the positioning holes (not illustrated) in the frame plate 11 in the sheet-like probe 10, whereby the anisotropically conductive connector 40 is arranged in such a manner that the conductive parts 52 for connection in the respective elastic anisotropically conductive films 50 respectively come into contact with the inspection electrodes 32 of the circuit board 31 for inspection, and on a front surface of the anisotropically conductive connector 40, the sheet-like connector 10 is arranged in such a manner that the electrode structures 17 thereof respectively come into contact with the respective conductive parts 52 for connection in the elastic anisotropically conductive films 50 of the anisotropically conductive connector 40. In this state, the three members are fixed to one another.

According to such a probe card 30 of the first embodiment, the above-described sheet-like probe according to the first embodiment is provided, so that positional deviation between the electrode structures 17 and the electrodes to be inspected by temperature changes can be surely prevented.

In addition, the anisotropically conductive film-arranging holes 42 in the frame plate 41 of the anisotropically conductive connector 40 are respectively formed corresponding to the electrode region, in which the electrodes to be inspected have been formed, of the integrated circuits in the wafer, which is the object of inspection, the elastic anisotropically conductive films 50 arranged in the respective anisotropically conductive film-arranging holes 42 may be small in area, and each of the elastic anisotropically conductive films 50 small in area is little in the absolute quantity of thermal expansion in a plane direction thereof, so that the thermal expansion in the plane direction of the elastic anisotropically conductive films 50 can be surely restrained by the frame plate 41. As a result, positional deviation between the conductive parts 52 for connection and, the electrode structures 17 and inspection electrodes 32 by temperature changes can be surely prevented.

Accordingly, in a burn-in test, a good electrically connected state to the wafer, which is the object of inspection, can be stably retained even when the wafer has a large area of 8 inches or greater in diameter, and the pitch of the electrodes to be inspected is extremely small.

Figure 32:
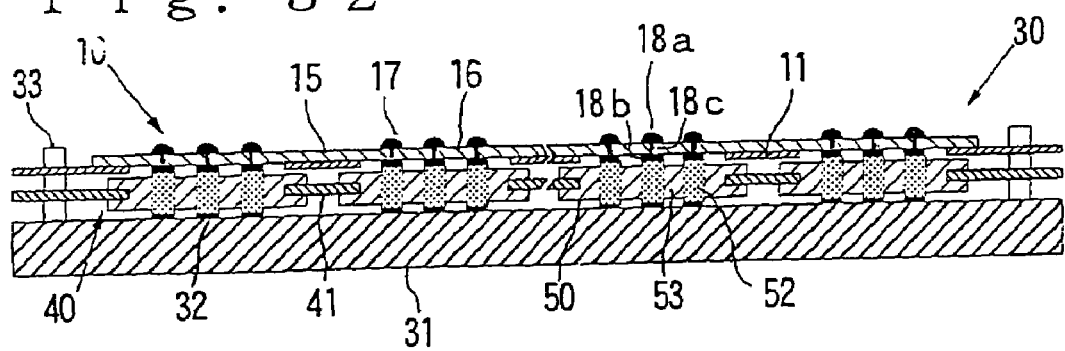
FIG. 32 is a cross-sectional view illustrating the construction of a probe card according to a second embodiment of the present invention.
Figure 33:
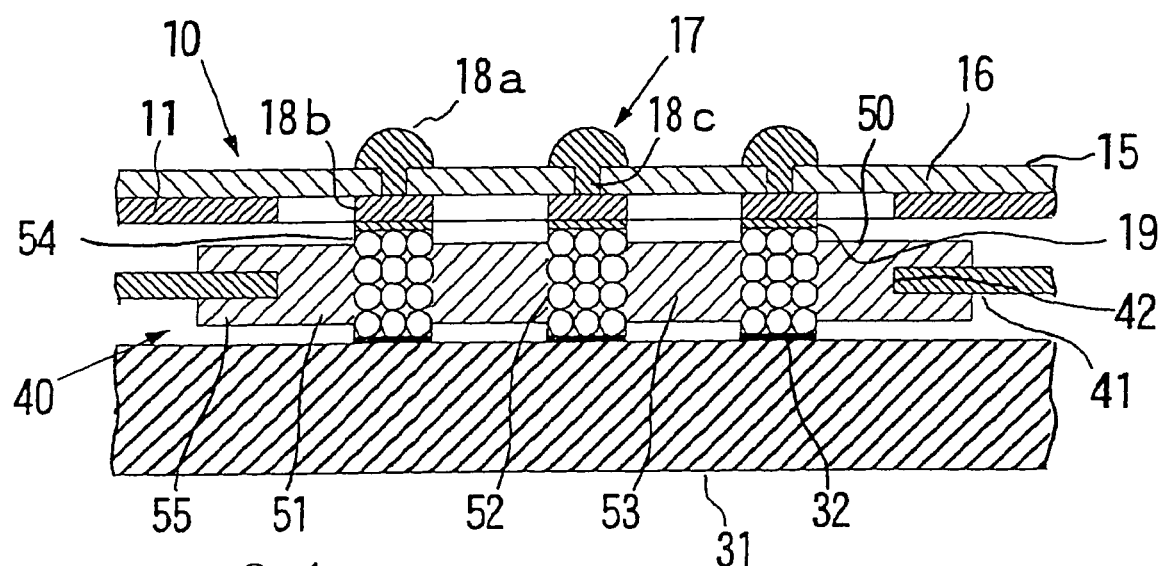
FIG. 33 is a cross-sectional view illustrating, on an enlarged scale, the construction of a principal part of the probe card according to the second embodiment.

FIG. 32 is a cross-sectional view illustrating the construction of a probe card according to a second embodiment of the present invention, and FIG. 33 is a cross-sectional view illustrating the construction of a principal part of the probe card according to the second embodiment.

The probe card 30 according to the second embodiment has the same construction as in the probe card 30 according to the first embodiment except that the sheet-like connector 10 according to the second embodiment is used in place of the sheet-like connector 10 according to the first embodiment.

According to such a probe card 30, the sheet-like probe according to the second embodiment is provided, so that positional deviation between the electrode structures 17 and the electrodes to be inspected by temperature changes can be surely prevented. In addition, the anisotropically conductive connector 40 of the same construction as in the probe card 30 according to the first embodiment is provided, so that positional deviation between the conductive parts 52 for connection and, the electrode structures 17 and inspection electrodes 32 by temperature changes can be surely prevented. Accordingly, in a burn-in test, a good electrically connected state to the wafer, which is the object of inspection, can be stably retained even when the wafer has a large area of 8 inches or greater in diameter, and the pitch of the electrodes to be inspected is extremely small.

[Wafer Inspection Apparatus]

Figure 34:
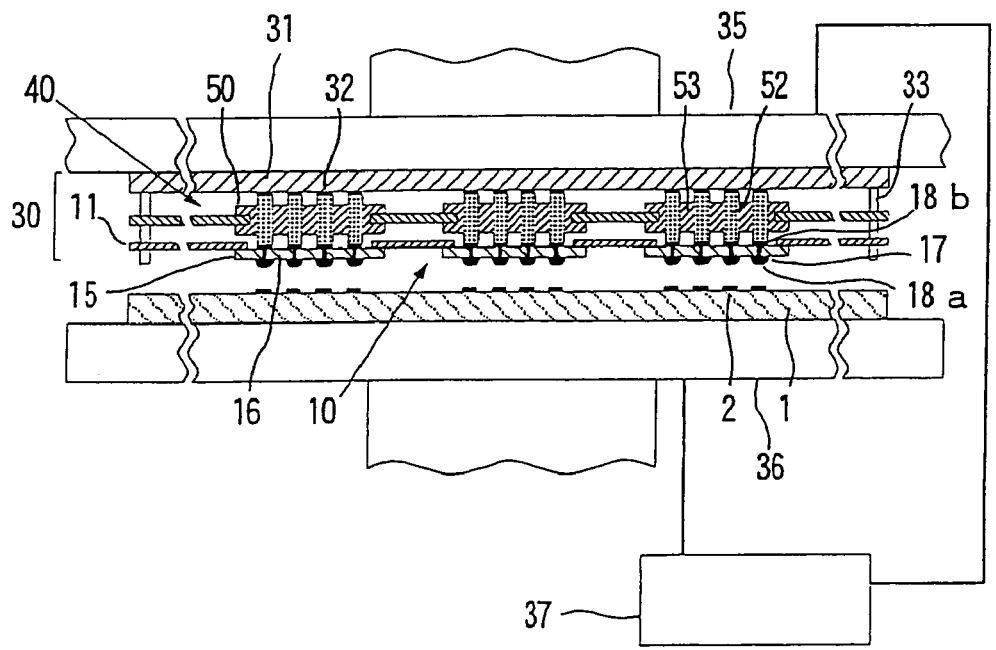
FIG. 34 is a cross-sectional view illustrating the construction of a wafer inspection apparatus according to a first embodiment of the present invention.

FIG. 34 is a cross-sectional view schematically illustrating the construction of a wafer inspection apparatus according to a first embodiment of the present invention. This wafer inspection apparatus serves to perform electrical inspection of each of a plurality of integrated circuits formed on a wafer in a state of the wafer.

The wafer inspection apparatus according to the first embodiment has the probe card 30 according to the first embodiment for conducting electrical connection of each of electrodes 2 to be inspected of a wafer 1, which is an object of inspection, to a tester. On a back surface of the circuit board 31 for inspection in this probe card 30, is provided a pressurizing plate 35 for pressurizing the probe card 30 downward. A wafer mounting table 36, on which the wafer 1 that is the object of inspection is mounted, is provided under the probe card 30. A heater 37 is connected to both pressurizing plate 35 and wafer mounting table 36.

In such a wafer inspection apparatus, the wafer 1, which is the object of inspection, is mounted on the wafer mounting table 36, and the probe card 30 is then pressurized downward by the pressurizing plate 35, whereby the respective front-surface electrode parts 18a in the electrode structures 17 of the sheet-like probe 10 thereof are brought into contact with their corresponding electrodes 2 to be inspected of the wafer 1, and moreover the respective electrodes 2 to be inspected of the wafer 1 are pressurized by the front-surface electrodes parts 18a. In this state, the conductive parts 52 for connection in the elastic anisotropically conductive films 50 of the anisotropically conductive connector 40 are respectively held and pressurized by the inspection electrodes 32 of the circuit board 31 for inspection and the front-surface electrode parts 18a of the-electrode structures 17 of the sheet-like probe 10 and compressed in the thickness-wise direction, whereby conductive paths are formed in the respective conductive parts 52 for connection in the thickness-wise direction thereof. As a result, electrical connection between the electrodes 2 to be inspected of the wafer 1 and the inspection electrodes 32 of the circuit board 31 for inspection is achieved. Thereafter, the wafer 1 is heated to a predetermined temperature through the wafer mounting table 36 and the pressurizing plate 35 by the heater 37. In this state, necessary electrical inspection is performed on each of a plurality of integrated circuits in the wafer 1.

According to such a wafer inspection apparatus according to the first embodiment, electrical connection to the electrodes 2 to be inspected of the wafer 1, which is the object of inspection, is achieved through the probe card 30 according to the first embodiment. Accordingly, in a burn-in test, a good electrically connected state to the wafer 1 can be stably retained even when the wafer 1 has a large area of 8 inches or greater in diameter, and the pitch of the electrodes 2 to be inspected is extremely small, and necessary electrical inspection can be surely performed on each of a plurality of integrated circuits in the wafer 1.

Figure 35:
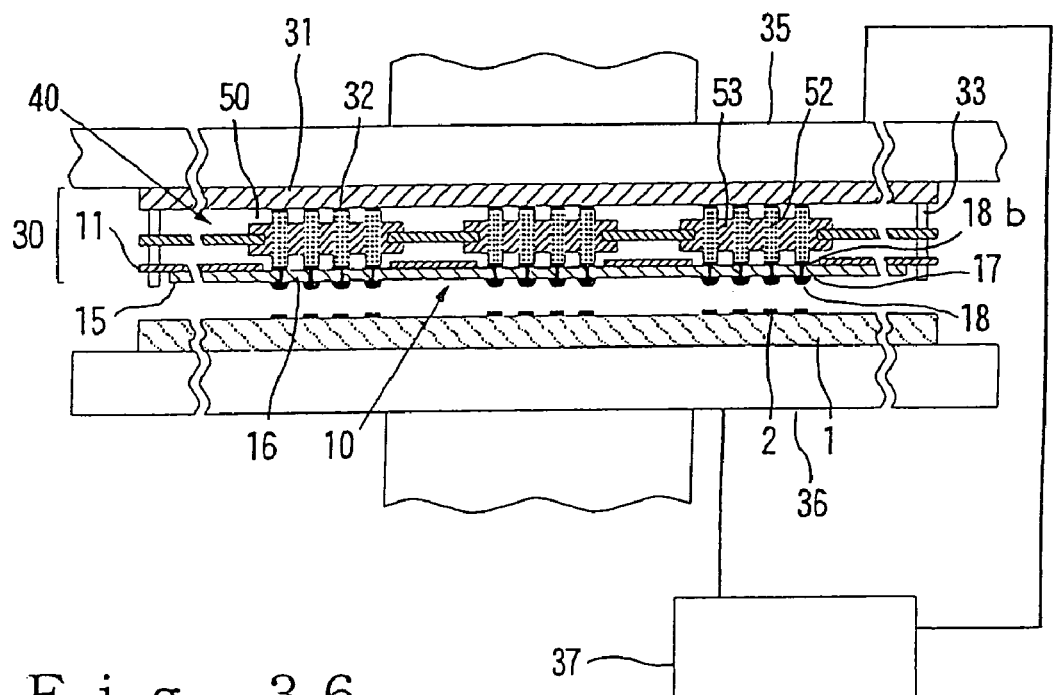
FIG. 35 is a cross-sectional view illustrating the construction of a wafer inspection apparatus according to a second embodiment of the present invention.
Figure 36:
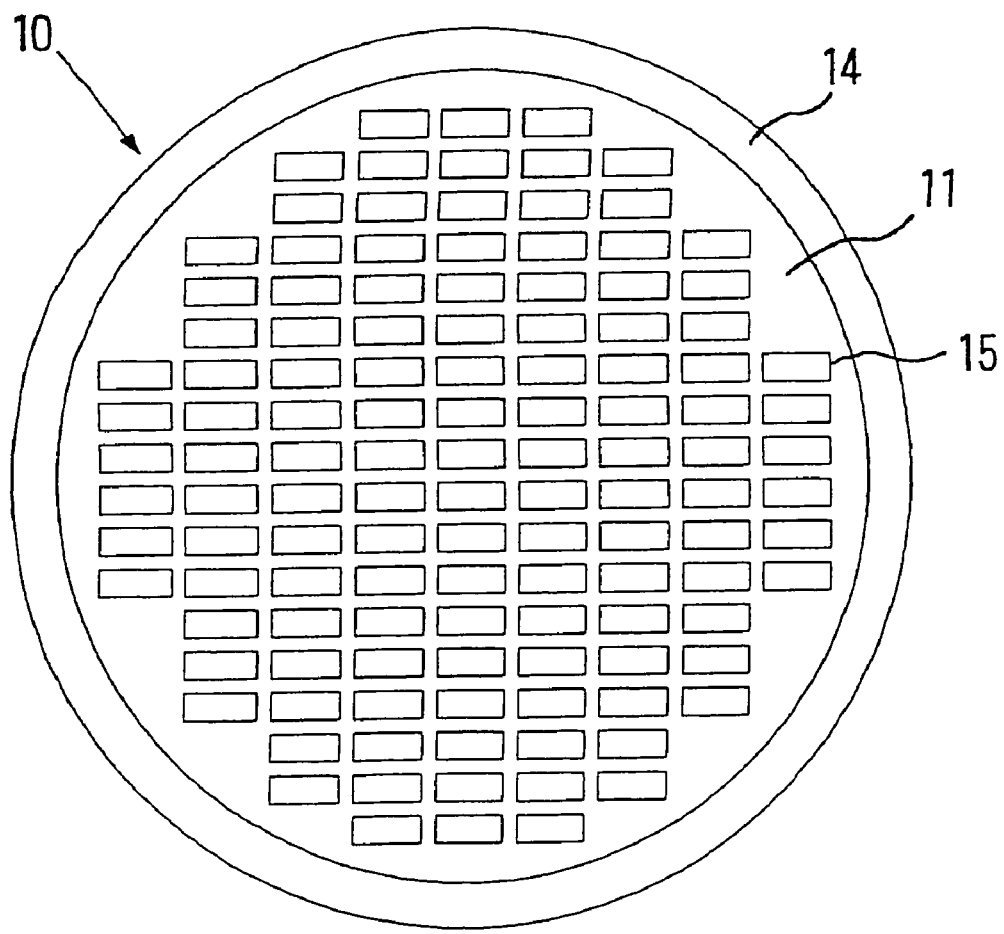
FIG. 36 is a plan view illustrating a sheet-like probe according to a further embodiment of the present invention.

FIG. 35 is a cross-sectional view schematically illustrating the construction of a wafer inspection apparatus according to a second embodiment of the present invention. This wafer inspection apparatus serves to perform electrical inspection of each of a plurality of integrated circuits formed on a wafer in a state of the wafer.

The wafer inspection apparatus according to the second embodiment has the same construction as in the wafer inspection apparatus except that the probe card 30 according to the second embodiment is used in place of the probe card 30 according to the first embodiment.

According to such a wafer inspection apparatus according to the second embodiment, electrical connection to the electrodes 2 to be inspected of the wafer 1, which is the object of inspection, is achieved through the probe card 30 according to the second embodiment. Accordingly, in a burn-in test, a good electrically connected state to the wafer 1 can be stably retained even when the wafer 1 has a large area of 8 inches or greater in diameter, and the pitch of the electrodes 2 to be inspected is extremely small, and necessary electrical inspection can be surely performed on each of a plurality of integrated circuits in the wafer 1.

The application of the sheet-like probes and probe cards according to the present invention are not limited to the wafer inspection apparatus, and they may be applied to inspection apparatus for packaged IC such as BGA and CSP, and circuit devices such as MCM.

The inspection apparatus for circuit devices according to the present invention are not limited to the wafer inspection apparatus according to the above-described embodiments, and various changes or modifications may be added thereto as described below.

(1) The probe cards 30 illustrated in FIGS. 29 and 32 are these collectively achieve electrical connection to electrodes to be inspected of all integrated circuits formed on a wafer. However, they may be electrically connected to electrodes to be inspected of a plurality of integrated circuits selected from among all the integrated circuits formed on the wafer. The number of integrated circuits selected is suitably selected in view of the size of the wafer, the number of integrated circuits formed on the wafer, the number of electrodes to be inspected in each of the integrated circuits, and the like. The number of integrated circuits selected is, for example, 16, 32, 64 or 128.

In the inspection apparatus having such a probe card 30, the probe card 30 is electrically connected to electrodes to be inspected of a plurality of integrated circuits selected from among all integrated circuits formed on a wafer to conduct inspection. Thereafter, the probe card 30 is electrically connected to electrodes to be inspected of a plurality of integrated circuits selected from among other integrated circuits to conduct inspection. These processes are repeated, whereby electrical inspection of all the integrated circuits formed on the wafer can be conducted.

According to such an inspection apparatus, the numbers of inspection electrodes and wires in a circuit board for inspection used can be lessened compared with a method of collectively conducting inspection as to all integrated circuits in the case where electrical inspection is conducted as to integrated circuits formed at a high degree of integration on a wafer having a diameter of 8 inches or 12 inches, whereby production cost of the inspection apparatus can be reduced.

(2) In the sheet-like probe 10, a ring-like holding member 14 may be provided at a peripheral edge portion of the frame plate 11.

As a material for forming such a holding member 14, may be used an invar alloy such as invar or superinvar, an Elinvar alloy such as Elinvar, a low-thermal expansion metallic material such as covar or 42 alloy, or a ceramic material such as alumina, silicon carbide or silicon nitride.

(3) In addition to the conductive parts 52 for connection formed in accordance with the pattern corresponding to the pattern of the electrodes to be inspected, conductive parts for non-connection that are not electrically connected to any electrode to be inspected may be formed in the elastic anisotropically conductive films 50 in the anisotropically conductive connector 40.

(4) In the present invention, the probe cards are not limited to those for inspection of wafers, and they may be constructed as probe cards for inspecting circuits formed in semiconductor chips, packaged LSI such as BGA and CSP, semiconductor integrated circuit devices such as MCM, and the like. In addition, inspection apparatus for circuit devices, which are equipped with such a probe card, may also be constructed.

EXAMPLES

The present invention will hereinafter be described specifically by the following Examples. However, the present invention is not limited to the following Examples.

[Production of wafer for test]

Figure 37:
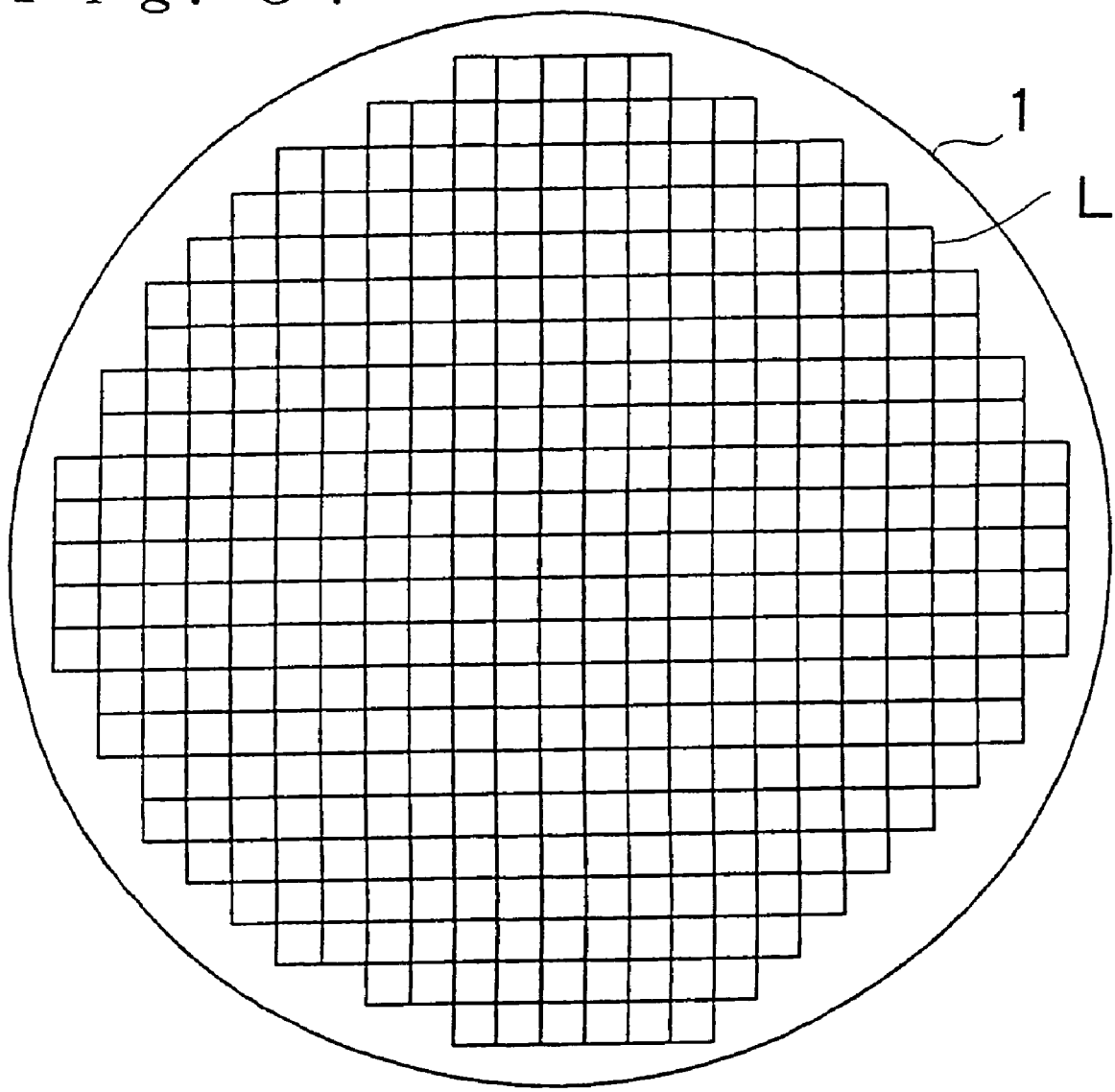
FIG. 37 is a plan view illustrating a wafer for test fabricated in Example.
Figure 38:
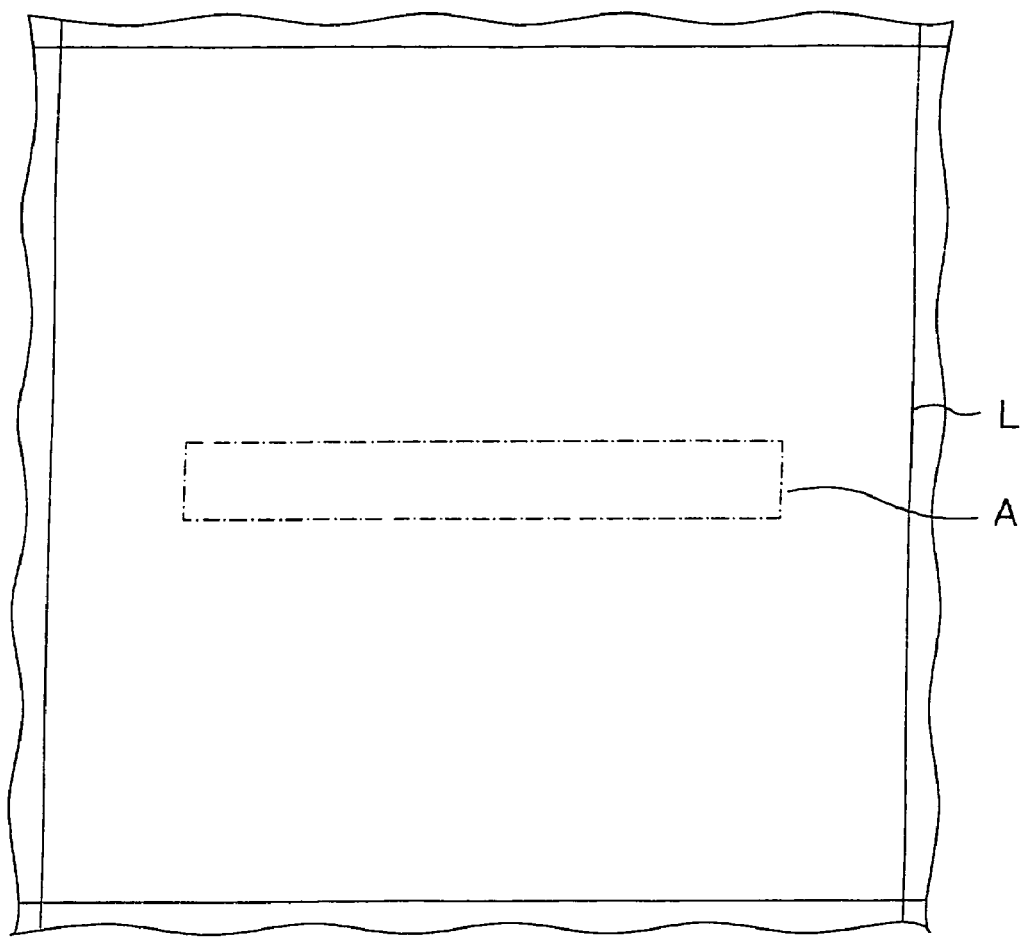
FIG. 38 illustrates a position of an electrode region of an integrated circuit formed on the wafer for test shown in FIG. 37.
Figure 39:
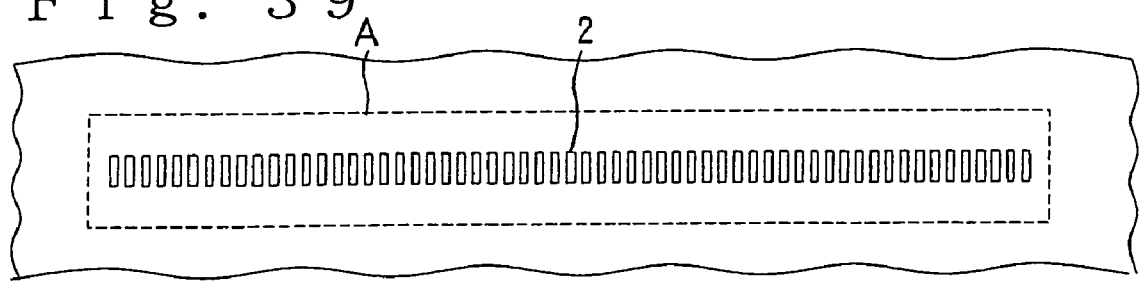
FIG. 39 illustrates an arrangement pattern of electrodes to be inspected of the integrated circuits formed on the wafer for test shown in FIG. 37.

As illustrated in FIG. 37, 393 square integrated circuits L in total, which each had dimensions of 8 mm×8 mm, were formed on a wafer 1 made of silicon (coefficient of linear thermal expansion: $3.3 \times 10^{-6}$/K) and having a diameter of 8 inches. Each of the integrated circuits L formed on the wafer 1 has a region A of electrodes to be inspected at its center as illustrated in FIG. 38. In the region A of the electrodes to be inspected, as illustrated in FIG. 39, 60 rectangular electrodes 2 to be inspected each having dimensions of 200 µm in a vertical direction (upper and lower direction in FIG. 39) and 50 µm in a lateral direction (left and right direction in FIG. 39) are arranged at a pitch of 100 µm in a line in the lateral direction. The total number of the electrodes 2 to be inspected in the whole wafer 1 is 23,580. All the electrodes 2 to be inspected are electrically insulated from one another. This wafer will hereinafter be referred to as "Wafer W1 for test".

Further, 393 integrated circuits (L), which had the same construction as in the Wafer W1 for test except that two electrodes each among 60 electrodes (2) to be inspected in each integrated circuit (L) were electrically connected to each other every second electrode counting from an endmost electrode (2) to be inspected in place of the fact that all the electrodes 2 to be inspected were electrically insulated from one another, were formed on a wafer (1). This wafer will hereinafter be referred to as "Wafer W2 for test".

Example 1

A laminated polyimide sheet with a copper layer having a diameter of 20 cm and a thickness of 5 µm laminated on one surface of a polyimide sheet having a diameter of 20 cm and a thickness of 12.5 µm and a laminated plate with a resin layer having a diameter of 20 cm and a thickness of 2.5 µm and composed of thermoplastic polyimide laminated on a surface of a metal plate having a diameter of 22 cm and a thickness of 25 µm and composed of 42 alloy were provided. The laminated polyimide sheet was then arranged on the surface of the resin layer of the laminated plate in such a manner that the polyimide sheet thereof faces the surface of the resin layer, and a protecting tape having an inner diameter of 20.4 cm, an outer diameter of 22 cm and a thickness of 25 µm and composed of polyethylene phthalate was arranged on a surface of a peripheral edge portion in the metal plate of the laminated plate. These were subjected to a pressure-bonding treatment under heat, thereby producing a laminate material (20) of the construction shown in FIG. 5.

The resultant laminate material (20) is such that a sheet (16A) for forming insulating films, which has a diameter of 20 cm and a thickness of 15 µm and is composed of polyimide, is integrally laminated on the surface of a metal plate (11A) for forming a frame plate, which has a diameter of 22 cm and a thickness of 25 µm and is composed of 42 alloy, a metal layer (21) having a thickness of 5 µm and composed of copper is integrally laminated on the surface of this sheet (16A) for forming insulating films, and a protecting tape (22) having an inner diameter of 20.4 cm, an outer diameter of 22 cm and a thickness of 25 µm is further provided along a peripheral edge portion on the surface of the metal plate (11A) for forming a frame plate.

On the whole front surface of the metal layer (21) in the laminate material (20) and on the whole back surface of the metal plate (11A) for forming a frame plate, resist films (23, 24) were respectively formed by a dry film resist (product of Hitachi Chemical Co., Ltd.; trade name: H-K350) having a thickness of 25 µm, and 23,580 circular patterned holes (23H) each having a diameter of 30 µm were formed in the resist film (23) formed on the front surface of the metal layer (21) in accordance with a pattern corresponding to the pattern of the electrodes to be inspected formed on Wafer W1 for test (see FIGS. 6 and 7). In the formation of the patterned holes (23H), an exposure treatment was conducted by irradiation of ultraviolet light of 80 mJ by a high pressure mercury lamp, and a development treatment was conducted by repeating a process of immersing the laminate material for 40 seconds in a developer composed of a 1% aqueous solution of sodium hydroxide twice.

The metal layer (21) was then subjected to an etching treatment with a ferric chloride etchant under conditions of 50° C. for 30 seconds, thereby forming a metal mask 21M, in which 23,580 openings (21H) linked to the respective patterned holes 23H in the resist film (23) are formed in the metal layer (21) (see FIG. 8). Thereafter, a protecting seal having a thickness of 25 µm and composed of polyethylene terephthalate was arranged on the surface of the resist film (24) formed on the metal plate (11A) for forming a frame plate in the laminate material (20), and this laminate material (20) was immersed in a sodium hydroxide solution at 45° C. for 2 minutes, thereby removing the resist film (23) from the laminate material (20) (see FIG. 9).

The sheet (16A) for forming insulating films in the laminate material (20) was then subjected to laser beam machining through the openings (21H) in the metal mask (21M), thereby forming, in the sheet (16A) for forming insulating films, 23,580 circular through-holes (17H) each having a diameter of 30 µm in accordance with the pattern corresponding to the pattern of the electrodes to be inspected formed on Wafer W1 for test (see FIG. 10). The laser beam machining was conducted under conditions that a laser species was excimer laser, a frequency (number of pulse per second) was 50 Hz, a beam width was 5 mm×5 mm, a scanning rate (moving speed of a stage in a laser beam machine) was 25 mm/sec, an energy density (irradiation energy of laser per unit area) was 0.8 J/cm$^2$, and the number of times of scanning was 100 times. Thereafter, the laminate material (20) was subjected to an etching treatment with a ferric chloride etchant under conditions of 50° C. for 30 seconds, thereby removing the metal mask (21M).

The laminate material (20) was then immersed in a plating bath containing nickel sulfamate to subject the laminate material (20) to an electroplating treatment by using, as an electrode, the metal plate (11A) for forming a frame plate, thereby filling a metal into the through-holes (17H) in the sheet (16A) for forming insulating films to form short circuit parts (18c), and at the same time form, on the surface of the sheet (16A) for forming insulating films, semi-spherical front-surface electrode parts (18a) integrally linked to the respective short circuit parts (18c) and having a diameter of about 75 µm and a projected height of about 25 µm (see FIG. 12). The electroplating treatment was conducted under conditions that a temperature of the plating bath was 50° C., a current density was 5 A/dm, and the period of the plating treatment was for 60 minutes.

Thereafter, a resist film (25) was formed by a liquid resist (product of JSR; trade name: THB-150N) so as to cover all the surfaces of the sheet (16A) for forming insulating films and the front-surface electrode parts (18a) of the laminated material (20), and a protecting seal having a thickness of 25 µm and composed of polyethylene terephthalate was additionally arranged on the surface of this resist film (25) (see FIG. 13).

The protecting seal arranged on the surface of the resist film (24) formed on the metal plate (11A) for forming a frame plate was then removed, and the exposed resist film (24) was subjected to an exposure treatment and a development treatment, thereby forming 393 patterned holes (24H) each having dimensions of 6,400 μm in a lateral direction and 320 μm in a vertical direction, and at the same time, forming 23,580 (60×393) rectangular resist patterns (24A) each having dimensions of 200 μm in a vertical direction and 40 μm in a lateral direction and arranged within the respective patterned holes (24H) so as to align at a pitch of 100 μm in the lateral direction in accordance with the pattern corresponding to the pattern of the electrode to be inspected, which had been formed on Wafer W1 for test (see FIG. 14). In this process, the exposure treatment was conducted by irradiation of ultraviolet light of 80 mJ by a high pressure mercury lamp, and the development treatment was conducted by repeating a process of immersing the laminate material for 40 seconds in a developer composed of a 1% aqueous solution of sodium hydroxide twice.

The metal plate (11A) for forming a frame plate in the laminate material (20) was then subjected to an etching treatment with a ferric chloride etchant under conditions of 50° C. for 30 seconds, thereby forming a frame plate (11), in which 393 through-holes (12) each having dimensions of 6,400 μm in a lateral direction and 320 μm in a vertical direction had been formed, and 23,580 (60×393) rectangular back-surface electrode parts (18b) each having dimensions of 200 μm in a vertical direction and 40 μm in a lateral direction and arranged in the respective through-holes (12) in the frame plate (11) so as to align at a pitch of 100 μm in the lateral direction (see FIG. 15).

The laminate material was then immersed for 2 minutes in a sodium hydroxide solution at 45° C., thereby removing the resist film (24) from the frame plate (11) and each of the back-surface electrode parts (18b) (see FIG. 16). Thereafter, a resist film (26) having a thickness of 25 μm was formed by a liquid resist (product of JSR; trade name: THB-150N) so as to cover a back surface of the frame plate (11), a back surface of the sheet (16A) for forming insulating films and the back-surface electrode parts (18b) respectively, and 23,580 rectangular patterned holes (26H) each having dimensions of 200 μm in a vertical direction and 40 μm in a lateral direction were formed at portions of this resist film (26), on which the back-surface electrode parts (18b) had been located, so as to expose the back-surface electrode parts (18b) (see FIGS. 17 and 18). In the formation of the patterned holes (26H), an exposure treatment was conducted by irradiation of ultraviolet light of 1,200 mJ/cm² by a high pressure mercury lamp, and a development treatment was conducted by immersing the laminate material at room temperature for 180 seconds in a developer (product of JSR; PD523)

The back-surface electrode parts (18b) were subjected to a gold plating treatment with a gold plating solution (product of Tanaka Kikinzoku Kogyo K.K., trade name: "LECTRO-LESS"), thereby forming a coating film (19) having a thickness of 0.2 μm and composed of gold on the surfaces of the back-surface electrode parts (18b), thus forming electrode structures (17) (see FIG. 19). Thereafter, a resist film (27) was formed on the surface of the coating layer (19) formed on the surface of each of the back-surface electrode parts (18b) by a liquid resist (product of JSR; trade name: THB-150N) (see FIG. 20).

The protecting seal arranged on the surface of the resist film (25) was then removed, and the resist film (25) was subjected to an exposure treatment and a development treatment, thereby forming patterned grooves (25H) extending in a vertical direction or a lateral direction and having a width of 1 mm, by which the electrode structures (17) were divided into groups each containing 60 electrode structures (see FIG. 21). In the formation of the patterned grooves, the exposure treatment was conducted by irradiation of ultraviolet light of 1,200 mJ/cm² by a high pressure mercury lamp, and the development treatment was conducted by immersing the laminate material at room temperature for 180 seconds in a developer (product of JSR; PD523).

Thereafter, the sheet (16A) for forming insulating films was subjected to an etching treatment with an amine type polyimide etchant (product of Toray Engineering Co., Ltd., "TPE-3000") under conditions of 80° C. for 10 minutes, thereby forming 393 insulating films (15) each having dimensions of 7.5 mm×7.5 mm and independent of one another, thus forming 393 contact films (12) (see FIG. 22).

The resist films (25, 26, 27) were then removed form the frame (11) and contact films (12), and the protecting tape (22) was removed from the frame plate (11). Thereafter, a silicone type thermosetting adhesive (product of Shin-Etsu Chemical Co., Ltd.; trade name: 1300T) was applied on to the surface of a peripheral edge portion in the frame plate (11), and a ring-like holding member (14) having an outer diameter of 220 mm, an inner diameter of 205 mm and a thickness of 2 mm and composed of silicon nitride was arranged on the portion, to which the silicone type thermosetting adhesive had been applied, in a state held at 150° C. Further, the frame plate (11) and the holding member (14) were held at 180° C. for 2 hours while pressurizing them, thereby producing a sheet-like probe (10) according to the present invention.

The specification of the sheet-like probe (10) thus obtained is as follows.

The frame plate (11) is in the form of a disk having a diameter of 22 cm and a thickness of 25 μm, and a material thereof is 42 alloy. The number of through-holes (12) in the frame plate (11) is 393, and the through-holes each have dimensions of 6,400 μm in a lateral direction and 320 μm in a vertical direction. The insulating film (13) in each of the 393 contact films (12) is composed of polyimide and has dimensions of 7,000 μm in a lateral direction, 700 μm in a vertical direction and a thickness of 15 μm. The number of the electrode structures (18) in each of the contact films (12) is 60 (23,850 in total), and they are arranged so as to align in a line at a pitch of 100 μm in the lateral direction. In each of the electrode structures (18), the front-surface electrode part (18a) is in a semi-spherical form having a diameter of about 75 μm and a projected height of about 25 μm, the short circuit part (18c) has a diameter of 30 μm, the back-surface electrode part (18b) is in a rectangular flat-plate form having dimensions of 40 μm×200 μm, and the thickness of the back-surface electrode part (18b) including the coating film (19) is 25.2 μm.

In such a manner, 4 sheet-like probes in total were produced. These sheet-like probes are referred to as "Sheet-like Probe M1" to "Sheet-like Probe M4".

Comparative Example 1

Four sheet-like probes in total were produced in the same manner as in Example 1 except that the formation of the frame plate by removing other portions than portions to become the back-surface electrode parts in the etching treatment of the metal plate for forming a frame plate was not conducted, and the holding member was provided on the surface of a peripheral edge portion of an insulating film. These sheet-like probes are referred to as "Sheet-like Probe N1" to "Sheet-like Probe N4".

<Production of anisotropically conductive connector>

(1) Preparation of magnetic core particles:

Commercially available nickel particles (product of Westaim Co., "FC1000") were used to prepare magnetic core particles in the following manner.

An air classifier "Turboclassifier TC-15N" manufactured by Nisshin Engineering Co., Ltd. was used to subject 2 kg of the nickel particles to a classification treatment under conditions of a specific gravity of 8.9, an air flow of 2.5 m$^3$/min, a rotor speed of 2,250 rpm, a classification point of 15 μm and a feed rate of the nickel particles of 60 g/min, thereby collecting 0.8 kg of nickel particles having a particle diameter of at most 15 μm, and 0.8 kg of the nickel particles were subjected to another classification treatment under conditions of a specific gravity of 8.9, an air flow of 2.5 m$^3$/min, a rotor speed of 2,930 rpm, a classification point of 10 μm and a feed rate of the nickel particles of 30 g/min to collect 0.5 kg of nickel particles.

The nickel particles thus obtained had a number average particle diameter of 7.4 μm, a coefficient of variation of particle diameter of 27%, a BET specific surface area of 0.46×10$^3$ m$^2$/kg and a saturation magnetization of 0.6 Wb/m$^2$.

The nickel particles are referred to as "Magnetic Core Particles [A]".

(2) Preparation of Conductive Particles:

Into a treating vessel of a powder plating apparatus, were poured 100 g of Magnetic Core Particles [A], and 2 L of 0.32N hydrochloric acid was further added. The resultant mixture was stirred to obtain a slurry containing Magnetic Core Particles [A]. This slurry was stirred at ordinary temperature for 30 minutes, thereby conducting an acid treatment for Magnetic Core Particles [A]. Thereafter, the slurry thus treated was left at rest for 1 minute to precipitate Magnetic Core Particles [A], and a supernatant was removed.

To the Magnetic Core Particles [A] subjected to the acid treatment, was added 2 L of purified water, and the mixture was stirred at ordinary temperature for 2 minutes. The mixture was then left at rest for 1 minute to precipitate Magnetic Core Particles [A], and a supernatant was removed. This process was conducted repeatedly additionally twice, thereby conducting a washing treatment for Magnetic Core Particles [A].

To the Magnetic Core Particles [A] subjected to the acid treatment and washing treatment, was added 2 L of a gold plating solution containing gold in a proportion of 20 g/L. The temperature of the treating vessel was raised to 90° C. and the contents were stirred, thereby preparing a slurry. While stirring the slurry in this state, Magnetic Core Particles [A] were subjected to displacement plating with gold. Thereafter, the slurry was left at rest while allowing it to cool, thereby precipitating particles, and a supernatant was removed, thereby preparing conductive particles.

To the conductive particles obtained in such a manner, was added 2 L of purified water, and the mixture was stirred at ordinary temperature for 2 minutes. Thereafter, the mixture was left at rest for 1 minute to precipitate the conductive particles, and a supernatant was removed. This process was conducted repeatedly additionally twice, 2 L of purified water heated to 90° C. was then added to the particles, and the mixture was stirred. The resultant slurry was filtered by filter paper to collect conductive particles. The conductive particles thus obtained were dried in a dryer set to 90° C.

The resultant conductive particles had a number average particle diameter of 7.3 μm and a BET specific surface area of 0.38×10$^3$ m$^2$/kg, and a value of (mass of gold forming a coating layer/mass of Magnetic Core Particles [A]) was 0.3.

The conductive particles are referred to as "Conductive Particles (a)".

Figure 40:
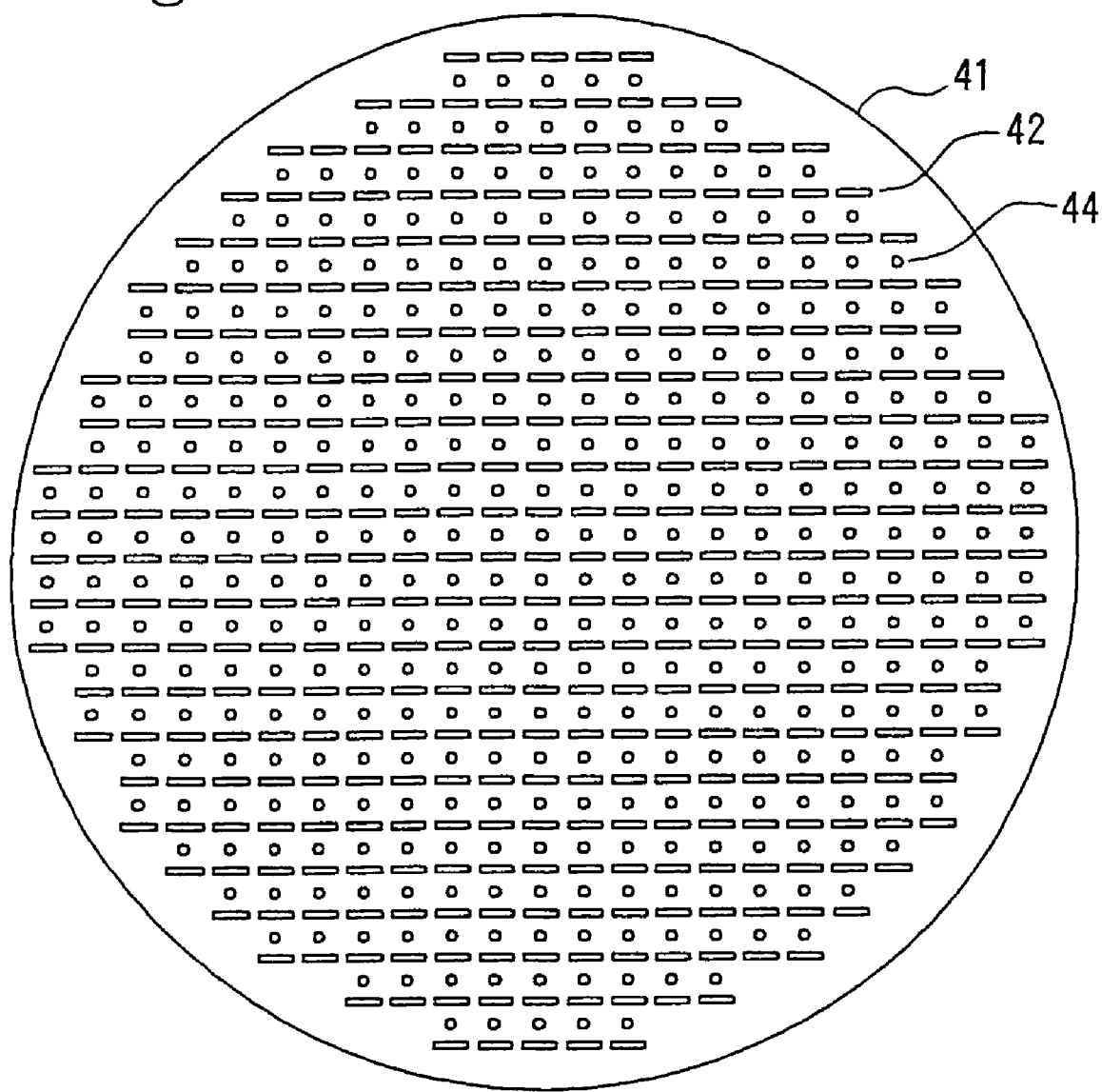
FIG. 40 is a plan view illustrating a frame plate in an anisotropically conductive connector produced in Example.
Figure 41:
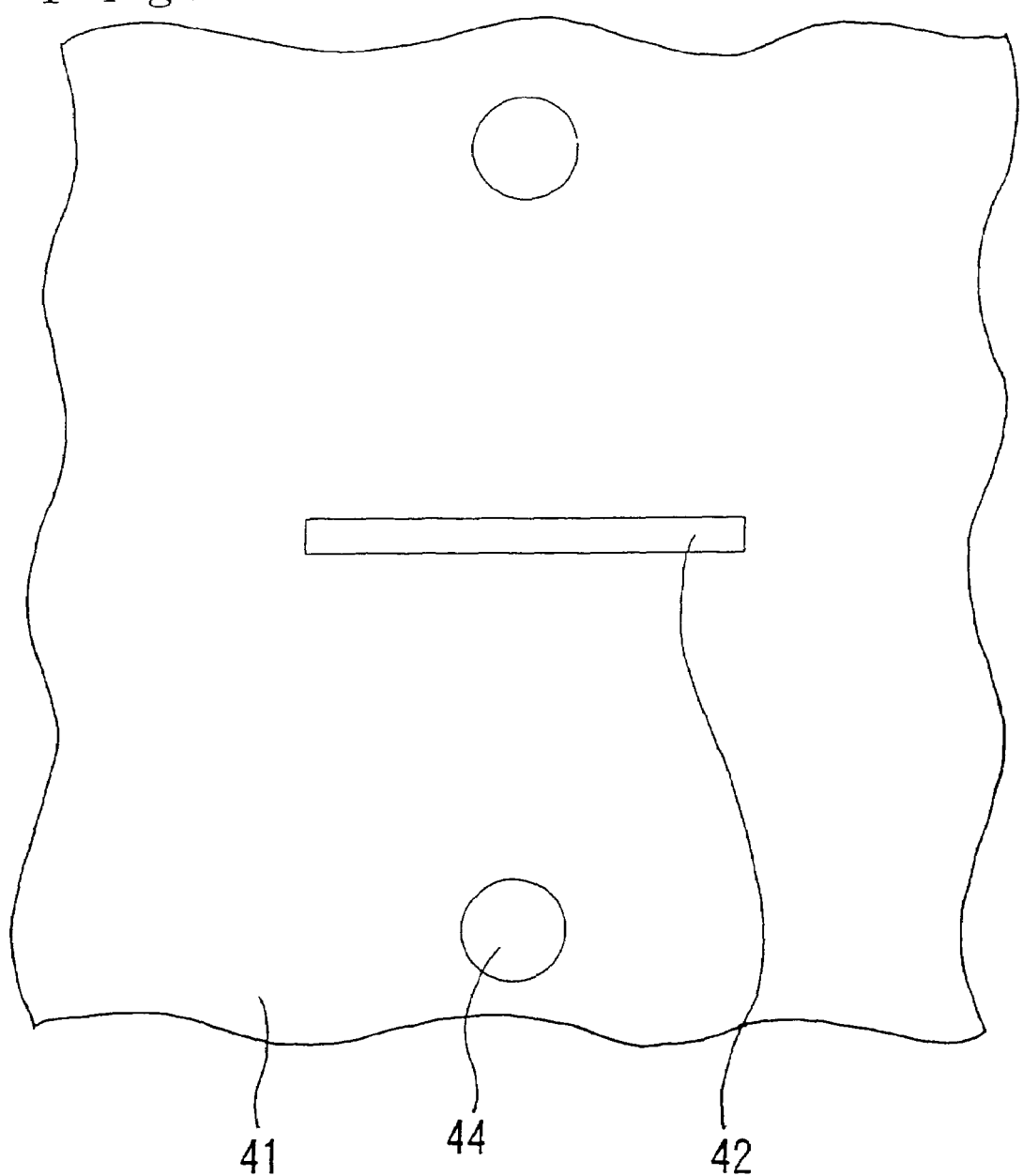
FIG. 41 illustrates, on an enlarged scale, a part of the frame plate shown in FIG. 40.
Figure 42:
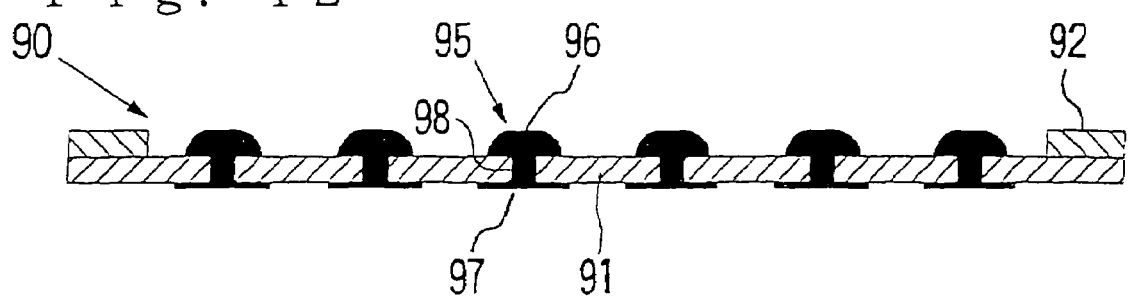
FIG. 42 is a cross-sectional view illustrating the construction of a conventional sheet-like probe.

(3) Production of Frame Plate:

A frame plate (41) having a diameter of 8 inches and 393 anisotropically conductive film-arranging holes (42) formed corresponding to the respective regions of the electrodes to be inspected in Wafer W1 for test described above was produced under the following conditions in accordance with the construction shown in FIGS. 40 and 41.

A material of this frame plate (41) is covar (coefficient of linear thermal expansion: 5×10$^{-6}$/K), and the thickness thereof is 60 μm.

The anisotropically conductive film-arranging holes (42) each have dimensions of 6,400 μm in a lateral direction (left and right direction in FIGS. 40 and 41) and 320 μm in a vertical direction (upper and lower direction in FIGS. 40 and 41).

A circular air inflow hole (44) is formed at a central position between anisotropically conductive film-arranging holes (42) adjoining in the vertical direction, and the diameter thereof is 1,000 μm.

(4) Preparation of Molding Material:

To 100 parts by weight of addition type liquid silicone rubber, were added 30 parts by weight of Conductive Particles [a] to mix them. Thereafter, the resultant mixture was subjected to a defoaming treatment by pressure reduction, thereby preparing a molding material.

In the above-described process, the addition type liquid silicone rubber and the cured product thereof used is of a two-pack type composed of Liquid A and Liquid B each having a viscosity of 250 Pa·s. The cured product thereof has a compression set of 5%, a durometer A hardness of 32 and tear strength of 25 kN/m.

In the present invention, the properties of the addition type liquid silicone rubber and the cured product thereof were measured in the following manner.

(i) A value was measured by means of a Brookfield type viscometer at 23±2° C. as the viscosity of the addition type liquid silicone rubber.

(ii) The compression set of the cured product of silicone rubber was measured in the following manner.

Liquid A and Liquid B in the two-pack type addition type liquid silicone rubber were stirred and mixed in proportions that that their amounts become equal. After this mixture was then poured into a mold and subjected to a defoaming treatment by pressure reduction, it was subjected to a curing treatment under conditions of 120° C. for 30 minutes, thereby forming a columnar body composed of a cured product of the silicone rubber and having a thickness of 12.7 mm and a diameter of 29 mm. This columnar body was post-cured under conditions of 200° C. for 4 hours. The columnar body obtained in such a manner was used as a specimen to measure a compression set at 150±2° C. in accordance with JIS K 6249.

(iii) Tear strength of cured product of silicone rubber was measured in the following manner.

A curing treatment and post-curing of addition type liquid silicone rubber were conducted under the same conditions as in the item (ii), thereby producing a sheet having a thickness of 2.5 mm. A crescent type specimen was prepared by punching from this sheet to measure its tear strength at 23±2° C. in accordance with JIS K 6249.

(iv) A value of the durometer A hardness was measured by using, as a specimen, a laminate obtained by stacking 5 sheets produced in the same manner as in the item (iii) on one another, at 23±2° C. in accordance with JIS K 6249.

(5) Production of Anisotropically Conductive Connector:

The frame plate (41) produced in the item (1) and the molding material prepared in the item (4) were used to form 393 elastic anisotropically conductive films (50) of the construction shown in FIG. 30, which were arranged within the respective anisotropically conductive film-arranging holes (42) in the frame plate (41) and respectively fixed and supported by peripheral portions about the anisotropically conductive film-arranging holes (42), in accordance with the process described in Japanese Patent Application Laid-Open No. 2002-324600, thereby producing an anisotropically conductive connector (40). The curing treatment of the molding material layers was conducted under conditions of 100° C. for 1 hour while applying a magnetic field of 2 T in a thicknesswise direction by electromagnets.

The resultant elastic anisotropically conductive films (50) will be described specifically. Each of the elastic anisotropically conductive films (50) has dimensions of 7,000 μm in a lateral direction and 1,200 μm in a vertical direction, and in a functional part (51) thereof, 60 conductive parts (52) for connection are arranged at a pitch of 100 μm in a line in the lateral direction in a state insulated from one another by an insulating part (53). With respect to each of the conductive parts (52) for connection, its dimensions are 40 μm in the lateral direction and 200 μm in the vertical direction, the thickness is 150 μm, the projected height of the projected part (54) is 25 μm, and the thickness of the insulating part (53) is 100 μm. Conductive parts for non-connection are arranged between the conductive part (52) for connection located most outside in the lateral direction and the frame plate (41). Each of the conductive parts for non-connection has dimensions of 60 μm in the lateral direction, 200 μm in the vertical direction and 150 μm in thickness. The thickness (thickness of one of the forked portions) of the part (55) to be supported in each of the elastic anisotropically conductive films (50) is 20 μm.

The content of the conductive particles in the conductive parts (52) for connection in each of the elastic anisotropically conductive films (50) was investigated. As a result, the content was about 25% in terms of a volume fraction in all the conductive parts (52) for connection.

In such a manner, 8 anisotropically conductive connectors in total were produced. These anisotropically conductive connectors are referred to as "Anisotropically Conductive Connector C1" to "Anisotropically Conductive Connector C8".

<Production of Circuit Board for Inspection>

Alumina ceramic (coefficient of linear thermal expansion: $4.8 \times 10^{-6}$/K) was used as a board material to produce a circuit board (30) for inspection, in which inspection electrodes (31) had been formed in accordance with the pattern corresponding to the pattern of the electrodes to be inspected in Wafer W1 for test. This circuit board (30) for inspection has dimensions of 30 cm×30 cm as a whole and is rectangular. The inspection electrodes thereof each have dimensions of 60 μm in the lateral direction and 200 μm in the vertical direction. The resultant circuit board for inspection is referred to as "Circuit Board T1 for inspection".

<Evaluation of Sheet-like Probe>

(1) Test 1 (Insulating Property Between Adjoining Electrode Structures)

Sheet-like Probe M1, Sheet-like Probe M2, Sheet-like Probe N1 and Sheet-like Probe N2 were respectively evaluated as to the insulating property between adjoining electrode structures in the following manner.

Wafer W1 for test was arranged on a test table at room temperature (25° C.), a sheet-like probe was arranged on the surface of Wafer W2 for test in alignment in such a manner that the respective front-surface electrode parts thereof are located on the electrodes to be inspected of Wafer W1 for test, an anisotropically conductive connector was arranged on this sheet-like probe in alignment in such a manner that the respective conductive parts for connection thereof are located on the back-surface electrode parts of the sheet-like probe, Circuit Board T1. for inspection was arranged on this anisotropically conductive connector in alignment in such a manner that the respective inspection electrodes thereof are located on the conductive parts for connection of the anisotropically conductive connector, and Circuit Board T1 for inspection was further pressurized downward under a load of 118 kg (load applied to an electrode structure: about 5 g on the average). In this process, that shown in the following Table 1 was used as the anisotropically conductive connector.

A voltage was successively charged to the 23,580 inspection electrodes in Circuit Board T1 for inspection, and an electric resistance between the inspection electrode, to which the voltage had been charged, and another inspection electrode was measured as an electric resistance (hereinafter referred to as "insulation resistance") between the electrode structures in the sheet-like probe to find a proportion (hereinafter referred to as "proportion of insulation failure") of measuring points, at which the insulation resistance was 10 MΩ or lower to all measuring points.

When the insulation resistance is 10 MΩ or lower, such a sheet-like probe is difficult to be actually used in electrical inspection of integrated circuits formed on a wafer.

The results are shown in Table 1.

TABLE 1

|  | Sheet-like Probe | Anisotropically Conductive Connector | Proportion of Insulation Failure |
| --- | --- | --- | --- |
| Example 1 | M1 | C1 | 0% |
|  | M2 | C2 | 0% |
| Comparative Example 1 | N1 | C3 | 0% |
|  | N2 | C4 | 0% |

(2) Test 2 (Connection Stability of Electrode Structures)

Sheet-like Probe M3, Sheet-like Probe M4, Sheet-like Probe N3 and Sheet-like Probe N4 were respectively evaluated as to the connection stability of the electrode structures to electrodes to be inspected in the following manner.

Wafer W2 for test was arranged on a test table equipped with a heater at room temperature (25° C.), a sheet-like probe was arranged on the surface of Wafer W2 for test in alignment in such a manner that the respective front-surface electrode parts thereof are located on the electrodes to be inspected of Wafer W2 for test, an anisotropically conductive connector was arranged on this sheet-like probe in alignment in such a manner that the respective conductive parts for connection thereof are located on the back-surface electrode parts of the sheet-like probe, Circuit Board T1 for inspection was arranged on this anisotropically conductive connector in alignment in such a manner that the respective inspection electrodes thereof are located on the conductive parts for connection of the anisotropically conductive connector, and Circuit Board T1 for inspection was further pressurized downward under a load of 118 kg (load applied to an electrode structure: about 5 g on the average). In this process, that shown in the following Table 2 was used as the anisotropically conductive connector.

With respect to the 23,580 inspection electrodes in Circuit Board T1 for test, an electric resistance between 2 inspection electrodes electrically connected to each other through the sheet-like probe, the anisotropically conductive connector and Wafer W2 for test were successively measured, and a half value of the electric resistance value measured was recorded as an electric resistance (hereinafter referred to as "conduction resistance") between an inspection electrode of Circuit Board T1 for inspection and an electrode to be inspected of Wafer W2 for test to find a proportion (hereinafter referred to as "proportion of connection failure") of measuring points, at which the conduction resistance was 1 Ω or higher, to all measuring points. This process is referred to as "Process (1)".

After the pressure against Circuit Board T1 for inspection was then released, the test table was heated to 150° C. and left to stand until the temperature became stable. Thereafter, Circuit Board T1 for inspection was pressurized downward under a load of 118 kg (load applied to an electrode structure: about 5 g on the average) to obtain a proportion of connection failure in the same manner as in the above-described Process (1). This process is referred to as "Process (2)".

The pressure against Circuit Board T1 for inspection was then released, and the test table was then cooled to room temperature (25° C.). This process is referred to as "Process (3)".

The above-described Process (1), Process (2) and Process (3) were regarded as a cycle, and the cycle was continuously repeated 500 times in total.

When the conduction resistance is 1 Ω or higher, such a sheet-like probe is difficult to be actually used in electrical inspection of integrated circuits formed on a wafer.

The results are shown in Table 2.

the front-surface electrode part in each of the electrode structures is in a projected form protruding from the front surface of the insulating film and wherein a ratio of the projected height of the front-surface electrode part to the diameter thereof in the electrode structure is from 0.2 to 3.

2. A probe card comprising the sheet-like probe according to claim 1.

3. An inspection apparatus for circuit devices, which comprises the probe card according to claim 2.

4. A probe card suitable for use in conducting electrical inspection of each of a plurality of integrated circuits formed on a wafer in a state of the wafer, which comprises:
a circuit board for inspection, on a front surface of which inspection electrodes have been formed in accordance with a pattern corresponding to a pattern of electrodes to be inspected of the integrated circuits of the wafer, which is an object of inspection, an anisotropically conductive connector arranged on the front surface of the circuit board for inspection, and the sheet-like probe according to claim 1 arranged on the front surface of the anisotropically conductive connector.

5. A wafer inspection apparatus for conducting electrical inspection of each of a plurality of integrated circuits formed on a wafer in a state of the wafer, which comprises:
the probe card according to claim 4.

6. A wafer inspection method comprising electrically connecting each of a plurality of integrated circuits formed on a

|  | Sheet-like Probe | Anisotropically Conductive Connector | Temperature | Proportion of Connection Failure Number Of Cycle | | | | |
|---|---|---|---|---|---|---|---|---|
|  |  |  |  | 1 time | 10 times | 50 times | 100 times | 200 times |
| Example 1 | M3 | C5 | 25° C. | 0% | 0% | 0% | 0% | 0% |
|  |  |  | 150° C. | 0% | 0% | 0% | 0% | 0% |
|  | M4 | C6 | 25° C. | 0% | 0% | 0% | 0% | 0% |
|  |  |  | 150° C. | 0% | 0% | 0% | 0% | 0% |
| Comparative Example 1 | N3 | C7 | 25° C. | 0% | 0% | 1% | 3% | 5% |
|  |  |  | 150° C. | 24% | at least 30% | at least 30% | at least 30% | at least 30% |
|  | N4 | C8 | 25° C. | 0% | 1% | 2% | 3% | 4% |
|  |  |  | 150° C. | 28% | at least 30% | at least 30% | at least 30% | at least 30% |

The invention claimed is:

1. A sheet-like probe suitable for use in electrical inspection of a circuit device, which comprises a frame plate made of a metal, in which a plurality of through-holes each extending through in a thickness-wise direction of the frame plate have been formed corresponding to an electrode region, in which electrodes to be inspected have been formed, of the circuit device, which is an object of inspection, and a plurality of contact films supported by a peripheral portion about the respective through-holes in the frame plate,
wherein each of the contact films is composed of an insulating film formed of a flexible resin and electrode structures extending through the insulating film in a thickness-wise direction thereof, arranged in accordance with a pattern corresponding to a pattern of the electrodes to be inspected in the electrode region and each having a front-surface electrode part exposed to a front surface of the contact films and a back-surface electrode part exposed to a back surface of the contact films, and each of the electrode structures is arranged so as to be located in the respective through-hole in the frame plate wherein wafer to a tester through the probe card according to claim 4 to perform electrical inspection of the integrated circuits formed on the wafer.

7. A sheet-like probe suitable for use in electrical inspection of a circuit device, which comprises a frame plate, in which a plurality of through-holes each extending through in a thickness-wise direction of the frame plate have been formed corresponding to an electrode region, in which electrodes to be inspected have been formed, of the circuit device, which is an object of inspection, and a contact film arranged on and supported by the frame plate,
wherein the contact film is composed of an insulating film formed of a flexible resin and electrode structures extending through in the insulating film in a thickness-wise direction thereof, arranged in accordance with a pattern corresponding to a pattern of the electrodes to be inspected and having a front-surface electrode part exposed to a front surface of the contact film and a back-surface electrode part exposed to a back surface of the contact film, and each of the electrode structures is arranged so as to be located in the respective through-holes in the frame plate wherein the front-surface electrode part in each of the electrode structures is in a projected form protruding from the front surface of the insulating film and wherein a ratio of the projected height of the front-surface electrode part to the diameter thereof in the electrode structure is from 0.2 to 3.

8. The sheet-like probe according to claim 7, wherein a plurality of contact films independent of each other are arranged so as to align along the surface of the frame plate.

9. The sheet-like probe according to claim 8, which is used for conducting electrical inspection of each of a plurality of integrated circuits formed on a wafer in a state of the wafer.

10. The sheet-like probe according to claim 9, wherein the pitch between the electrode structures is 40 to 250 μm, and the total number of the electrode structures is at least 5,000.

11. The sheet-like probe according to claim 7, wherein the electrode structure is formed by linking the front-surface electrode part and the back surface electrode part to each other through a short circuit part extending through in the insulating film.

12. The sheet-like probe according to claim 11, wherein the back-surface electrode part in the electrode structure has a part formed of the same metal as a metal forming the frame plate.

13. The sheet-like probe according to claim 12, wherein a coating film formed of a high-conductive metal is formed on the back-surface electrode part in the electrode structure.

14. The sheet-like probe according to claim 13, wherein the coefficient of linear thermal expansion of the frame plate is at most $3 \times 10^{-5}$/K.

15. A process for producing the sheet-like probe according to claim 11, which comprises the steps of:
   providing a laminate material having a metal plate for forming a frame plate and a sheet for forming insulating film, which has been integrally laminated on the metal plate for forming a frame plate,
   forming through-holes in the resin sheet for forming insulating film in the laminate material in accordance with a pattern corresponding to a pattern of electrode structures to be formed, subjecting the laminate material to a plating treatment, thereby forming short circuit parts formed in the respective through-holes in the resin sheet for forming insulating film and linked to the metal plate for forming a frame plate, and front-surface electrode parts linked to the respective short circuit parts, and then
   subjecting the metal plate for forming a frame plate to an etching treatment, thereby forming a frame plate, in which through-holes have been formed.

16. The process according to claim 15 for producing the sheet-like probe, wherein the metal plate for forming a frame plate is subjected to the etching treatment to form back-surface electrode parts linked to the short circuit part by a part of the metal plate for forming a frame plate as well as forming the frame plate, in which the through-holes have been formed.

* * * * *